United States Patent
Kato

[11] Patent Number: 6,034,780
[45] Date of Patent: Mar. 7, 2000

[54] SURFACE POSITION DETECTION APPARATUS AND METHOD

[75] Inventor: Masaki Kato, Yokohama, Japan

[73] Assignee: Nikon Corporation, Tokyo, Japan

[21] Appl. No.: 09/050,699

[22] Filed: Mar. 30, 1998

[30] Foreign Application Priority Data

| Mar. 28, 1997 | [JP] | Japan | 9-094867 |
| Apr. 21, 1997 | [JP] | Japan | 9-117557 |
| Feb. 12, 1998 | [JP] | Japan | 10-046169 |
| Feb. 13, 1998 | [JP] | Japan | 10-048821 |

[51] Int. Cl.$^7$ .............................. G01B 11/26
[52] U.S. Cl. ................................ 356/400; 250/548
[58] Field of Search .................... 356/400, 401, 356/399, 375, 373, 358, 356; 250/548

[56] References Cited

U.S. PATENT DOCUMENTS

| 5,216,235 | 6/1993 | Lin ........................................ 250/201 |
| 5,412,214 | 5/1995 | Suzuki et al. ........................... 250/548 |
| 5,416,562 | 5/1995 | Ota et al. ................................. 355/53 |
| 5,633,721 | 5/1997 | Mizutani ................................ 356/401 |

FOREIGN PATENT DOCUMENTS

| 5642205 | 4/1981 | Japan .............................. G02B 7/11 |
| 5204166 | 8/1993 | Japan .............................. G03F 9/02 |
| 5129182 | 5/1998 | Japan .......................... H01L 21/027 |

*Primary Examiner*—Frank G. Font
*Assistant Examiner*—Tu T. Nguyen

[57] ABSTRACT

A surface displacement detection apparatus that detects the displacement of a substrate W with respect to a predetermined reference plane (X-Y plane). The apparatus includes an illumination optical system that irradiates light toward a first detection location among N detection locations initially removed from each other on substrate W, wherein $N \geq 2$. The apparatus also includes a re-illumination optical system that directs light reflected from the first detection location to subsequent detection locations on substrate W so that the light from the illumination optical system impinges on each of the N detection locations. The apparatus further includes a detection optical system that converges the light reflected from the last detection location on substrate W onto a light receiving surface, a photoelectric detection unit that photoelectrically detects the displacement of the light received at the light receiving surface. Information with respect to the displacement of the light from all N detection locations is included in the light that is converged on the light receiving surface by the detection optical system. The detection optical system is separated from the illumination optical system so as to receive light reflected from the second detection location removed from the first detection location.

33 Claims, 13 Drawing Sheets

SURFACE POSITION DETECTION APPARATUS AND METHOD

FIELD OF THE INVENTION

The present invention pertains to a position detection apparatus and method for detecting the inclination and displacement (i.e., position) of a surface, and in particular to such apparatus and methods used in manufacturing products having a planar surface, such as semiconductor wafers and liquid crystal panels, whose position during manufacturing needs to be known to a high degree of precision.

BACKGROUND OF THE INVENTION

The detection of surface inclination (i.e., the orientation a surface relative to an XY reference plane) and surface displacement (i.e., the off-set of a surface in the Z-direction relative to an XY reference plane), referred to herein collectively as "surface position," is important in manufacturing of products having a planar surface whose position during the manufacturing process needs to be known with a high degree of precision. Such products include, for example, liquid crystal panels, semiconductor integrated circuits, thin-film magnetic heads, change-coupled devices (CCDs), and the like.

To determine the inclination of a surface in general, it is sufficient to detect the relative displacement of two points on the surface. Position detection apparatuses for measuring the position of a surface by obliquely illuminating the surface with light and detecting the light obliquely reflected therefrom are known. For example, such surface position detection apparatuses are described at Japanese Unexamined Patent Application (Kokai) No. S56[1981]-42205, Japanese Unexamined Patent Application (Kokai) No. H5[1993]-129182, and Japanese Unexamined Patent Application (Kokai) No. H5[1993]-204166.

The surface displacement detection system described at Japanese Unexamined Patent Application (Kokai) No. H5-204166 is, in particular, well-suited for detection of surface displacement of large substrates. This surface displacement detection system is arranged such that it is equipped with two light sources and two detectors. The light from each light source is split by a half prism, thereby forming two light beams, which are guided to two detection locations on the surface being measured. Light from each light beam is reflected from each detection location and is respectively received by the two detectors, which allows for the displacements at the respective detection locations to be measured. The two light sources turn on and off in time division fashion to permit simultaneous measurement of the respective displacements of two points. The displacements of the detection locations at a total of four locations broadly separated from one another around the periphery of a large substrate can thus be detected using two light sources and two detectors. For each such detection location, the inclination of the substrate in the direction of a line drawn between it and another point may be determined from the relative difference in displacements between the two points.

However, there are problems associated with using this type of surface inclination detection apparatus. For instance, because the detection locations are detected in a time-division fashion, detecting of all of the many detection locations on the detection target surface and determining the inclination of the substrate has been time consuming, which reduces the ability to process substrates in a given time interval (i.e., reduces "throughput"). Furthermore, attempts to remedy this problem with similar arrangements requires respective optical systems for the several detection locations, resulting in a complicated apparatus. This represents a serious impediment from the standpoints of design and manufacturing, and has resulted in excessive expenditure of labor.

SUMMARY OF THE INVENTION

The present invention pertains to a position detection apparatus and method for detecting the inclination and displacement of a surface, and in particular to such apparatus and methods used in manufacturing products having a planar surface, such as semiconductor wafers and liquid crystal panels, whose position during manufacturing needs to be known to a high degree of precision.

More particularly, in one aspect of the invention, a surface inclination detection apparatus is provided for detecting the inclination of a surface W relative to a reference surface. The apparatus includes an illumination optical system that directs light toward a first detection location on the surface W and a re-illumination optical system that directs light reflected from the first detection location to a second detection location on the surface W. In addition, the apparatus has a detection optical system that converges a first light beam reflected from the second detection location removed from the first detection location onto a second light beam receiving surface and a photoelectric detection unit that photoelectrically detects a displacement in the light received at the light-receiving surface.

In another aspect of the invention, a method of exposing a substrate having a photosensitive surface is provided. The method includes the steps of providing a projection exposure apparatus comprising an exposure optical system for illuminating with exposure light a mask having a pattern, a projection optical system for projecting an image of the mask onto the photosensitive surface, a substrate stage for supporting the substrate, and the surface inclination detection measuring apparatus described above. The next step is disposing the substrate on the substrate stage. The next steps involve detecting the inclination of the photosensitive surface of the substrate using the inclination detection apparatus and adjusting the inclination of the photosensitive surface based on an output from the photoelectric detection unit. The final step comprises exposing the photosensitive surface.

DETAILED DESCRIPTION OF THE INVENTION

The present invention pertains to a position detection apparatus and method for detecting the inclination and displacement of a surface, and in particular to such apparatus and methods used in manufacturing products having a planar surface, such as semiconductor wafers and liquid crystal panels, whose position during manufacturing needs to be known to a high degree of precision.

Figure 1:
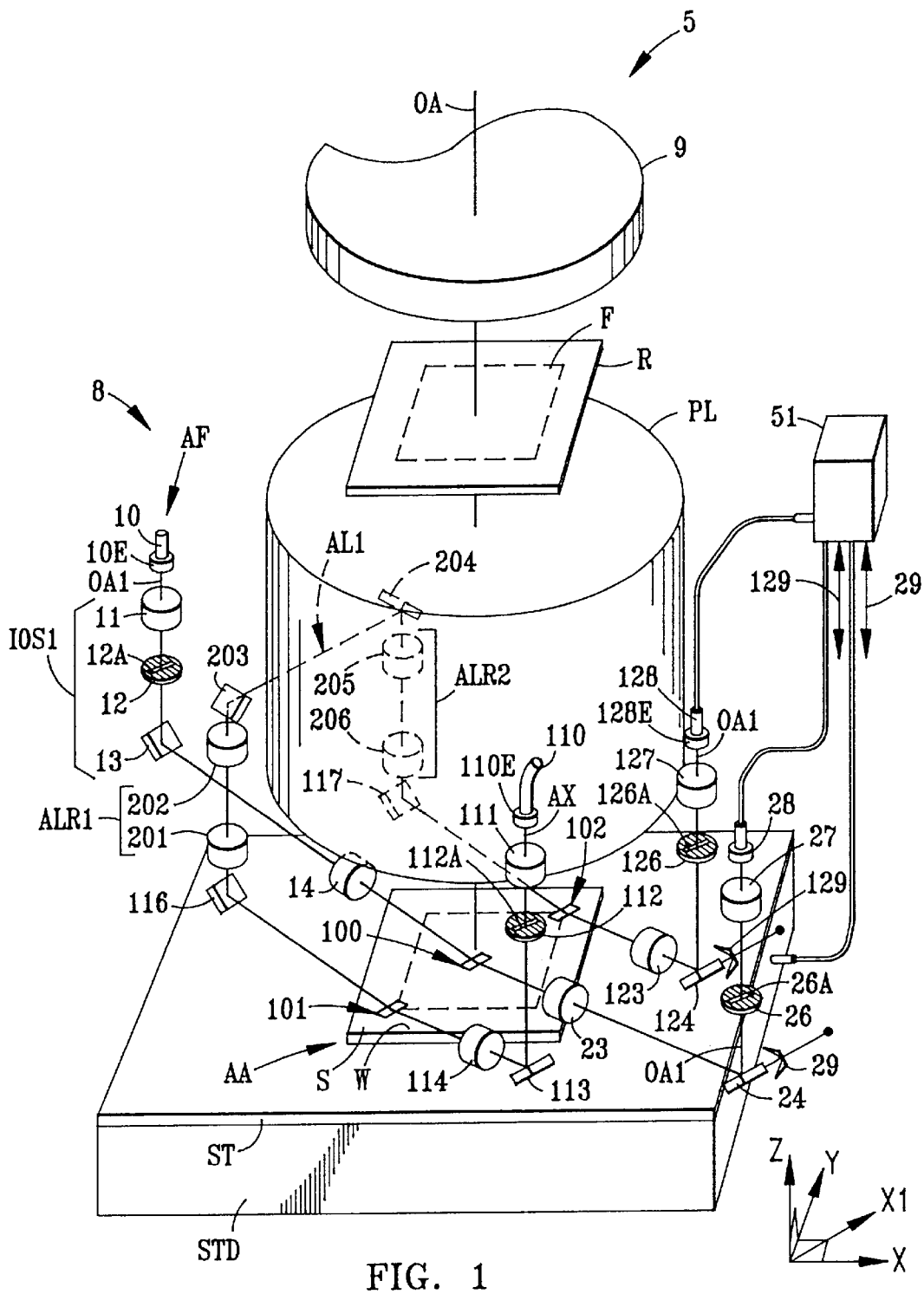
FIG. 1 is a perspective view of a preferred embodiment of the surface position detection apparatus of present invention incorporated within a projection exposure apparatus.

Referring to FIG. 1, projection exposure apparatus 5, which can be used for semiconductor, liquid crystal display manufacturing, or the like, includes an illumination system 9 disposed adjacent a projection lens PL. Projection lens PL has an object plane (not shown) with an associated depth of field, an image plane (not shown) with an associated depth of focus, and an optical axis OA. A reticle R is disposed at or near the object plane, within the depth of field, between projection lens PL and illumination system 9. Reticle R may contain, for example, a pattern with small (micron and sub-micron dimension) features (not shown). A stage ST moveable in the X,Y and Z directions (see coordinate system in FIG. 1), is disposed adjacent projection lens PL opposite to illumination system 9 at or near the image plane. A substrate S with a detection target surface W is placed on stage ST. A drive apparatus STD for driving stage ST is disposed adjacent stage ST opposite projection lens PL. The surface of stage ST on which the substrate S is placed is more or less parallel to the XY coordinate plane. A reference surface RS (see FIG. 5) is typically the XY coordinate plane or a plane parallel to the XY coordinate plane, such as the image or object planes of projection lens PL.

With continuing reference to FIG. 1, illuminating reticle R, with light from illumination system 9, causes an image of the pattern on reticle R to be exposed, by way of projection lens PL, onto the detection target surface (hereinafter, "surface") W, which is disposed at or near the image plane, within the depth of focus. In this manner, a liquid crystal display device or semiconductor integrated circuit is manufactured.

Many of the industrial applications employing projection exposure apparatus, such as semiconductor manufacturing and liquid crystal display device fabrication, require that prior to exposure, the position of a particular surface (i.e., surface W) upon which an image is to be projected be known with a high degree of precision. For instance, in semiconductor manufacturing, the depth of focus of the features being printed using a given projection lens is typically ±1 micron or less. Thus, any inclination of surface W relative to the rear focal plane (i.e., tilt with respect to the X-Y plane), or displacement of the surface W in the Z-direction (i.e., defocus) can result in printing errors. Also, in semiconductor manufacturing, precise alignment of the various layers of the chip levels requires precise positioning of the wafer between exposures. Misalignment of the chip levels can result in malfunctioning of the circuits and a reduction in chip yield. Accordingly, where proper positioning of the surface W is required, projection exposure apparatuses include a position detection apparatus. Thus, with continuing reference to FIG. 1, projection exposure apparatus 5 includes a position detection apparatus 8 of the present invention. Position detection apparatus 8 includes a surface displacement detection apparatus, hereinafter referred to as "autofocus system AF" (see FIG. 2). Autofocus system AF detects the displacement of surface W in the Z-direction at a detection location 100 defined by the intersection of surface W and optical axis OA. This allows for surface W to be moved in the Z-direction via stage ST (or alternatively, by moving projection lens PL in the Z-direction) so it is in the proper (e.g., best focus) position.

Figure 2:
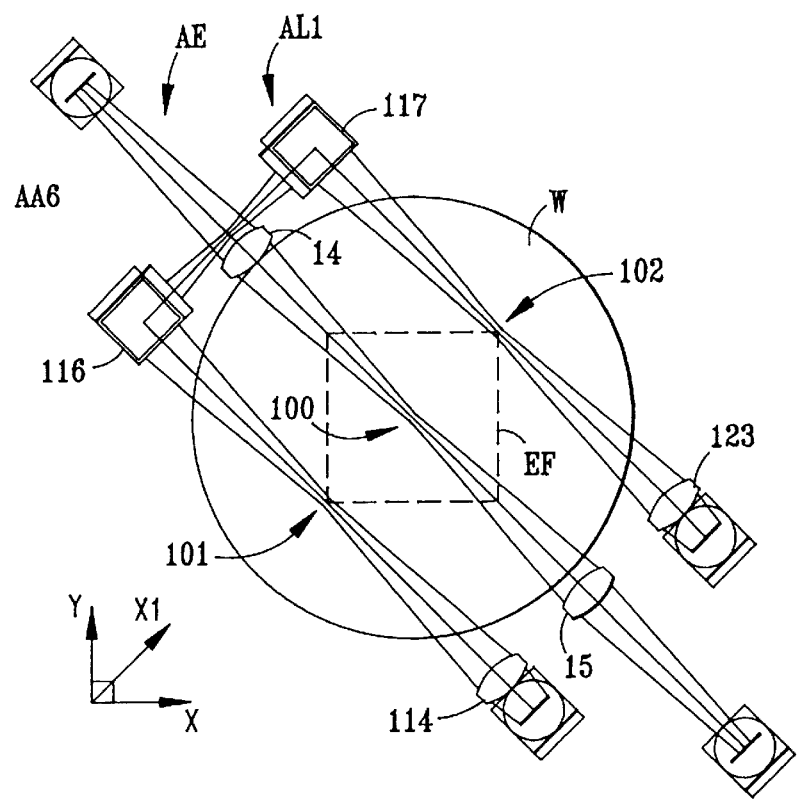
FIG. 2 is a plan view of the surface position detection apparatus of FIG. 1 as viewed from a point between the projection lens and the substrate.

With continuing reference to FIGS. 1 and 2, autofocus system AF incorporated within projection exposure apparatus 5 is disposed adjacent projection lens PL and includes an optical fiber 10 with an end 10E, which guides light to be used for illumination from a light source such as, for example, a halogen lamp (not shown). Optical fiber 10 is arranged so that light is emitted from fiber end 10E in a direction substantially parallel to the Z-axis along optical axis OA1. Arrayed along optical axis OA1 in order from fiber end 10E are, a condenser lens 11 for concentrating the light emitted from fiber end 10E, a transmitting aperture plate 12 having a slit-shaped aperture (hereinafter, "slit") 12A, and a mirror 13 to bend the light path and optical axis OA1. Mirror 13 is inclined such that light passing through slit 12A is obliquely incident at detection location 100 on surface W. An objective lens 14 disposed between mirror 13 and detection location 100, images slit 12A onto surface W. In other words, when surface W is aligned with a reference surface (e.g., the image plane of projection lens PL), slit 12A and surface W are optically conjugate. Furthermore, objective lens 14 is image-side telecentric (i.e., telecentric on the side of surface W). Components 10–14 constitute an illumination optical system IOS1.

It should be noted that, in practice, the patterns formed on surface W in manufacturing semiconductor integrated circuits or liquid crystal displays typically include horizontal and vertical lines. It is preferred that the long axis of the image of slit 12A at detection location 100 not be aligned with the directions of such horizontal and vertical lines. Thus, the long axis of slit 12A is arranged so that its image falls on surface W at an angle with respect to such lines. For example, if surface W is placed on stage ST such that any horizontal and vertical lines thereon line up with the X and Y coordinate axes, the long axis of slit 12A will be parallel to the direction $X_1$ (see coordinate axes in FIG. 1). Direction $X_1$ forms an angle of 45 degrees with the X axis in the XY plane. The reason for orienting the image of slit 12A in this manner is to average out nonuniformities in reflectance and brightness resulting from such patterns on surface W. This improves the precision with which the displacement of surface W is detected. Note that while 45 degrees is a preferred angle, it is sufficient that the image of the slit be formed such that it crosses the horizontal and vertical lines of the pattern. Thus, other angles such as 30 degrees or 60 degrees may be acceptable. The same holds true for the detection locations described below in connection with measuring surface inclination.

Figure 3:
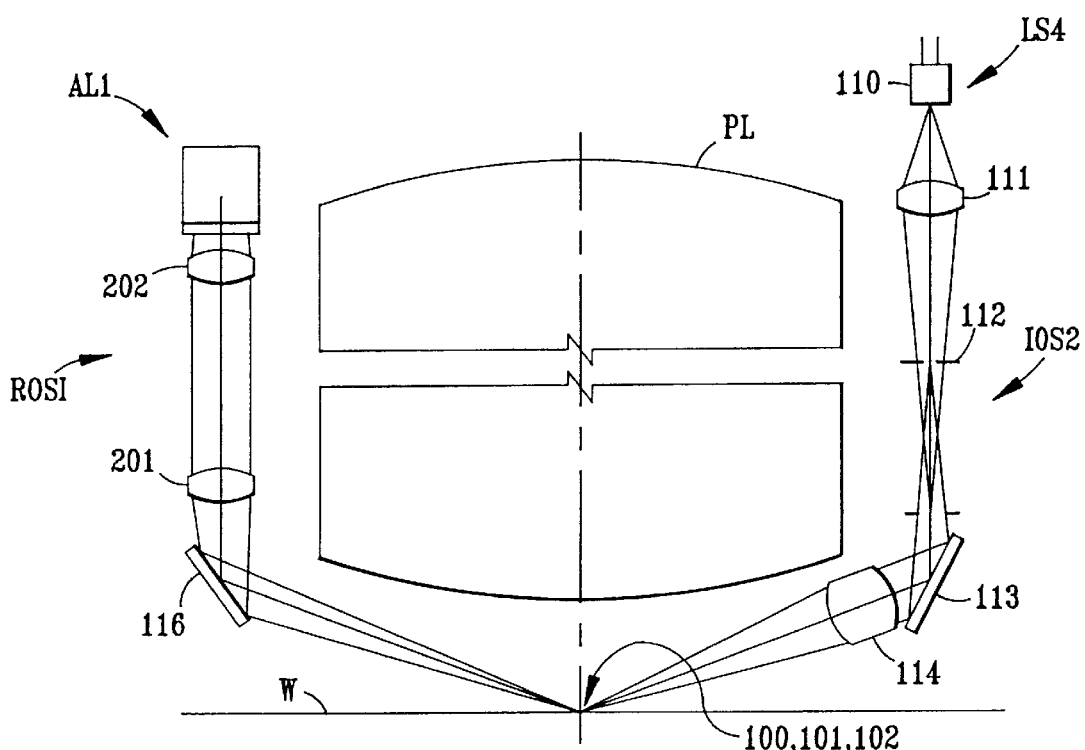
FIG. 3 is a side view of the surface position detection apparatus of the present invention shown in FIG. 1, as viewed in the direction of arrow AA in FIG. 1.

With continuing reference to FIGS. 1 and 3, autofocus system AF further includes an objective lens 23 disposed such that the front focus thereof is located at detection location 100 when surface W is aligned with a reference surface, such as the image plane of projection lens PL. Objective lens 23 is telecentric with respect to the object side (i.e., the side of surface W). Objective lens 23 images light reflected from detection location 100 onto a receiving aperture plate 26 having a slit aperture ("slit") 26A. In other words, detection location 100 on surface W and receiving aperture plate 26 are optically conjugate. The long axis of slit 26A is arranged to be in the same direction as the image of slit 12A falling on receiving aperture plate 26. Disposed between objective lens 23 and receiving aperture plate 26 is an oscillating mirror 24, which reflects light arriving from objective lens 23 and bends optical axis OA1 in a direction parallel to the Z-axis. Downstream from receiving aperture plate 26 is a condenser lens 27, which images light that has passed through slit 26A and images it onto detector 28. Detector 28 may be, for example, a photoelectric detector, such as a silicon photodiode (SPD), which converts light energy into an electrical signal. Components 23–24 constitute a detection optical system DOS1 (not shown), and components 26–28 constitute a photoelectric detection unit POU1 (not shown).

With continuing reference to FIG. 1, the operation of AF system 10 is briefly described. Oscillating mirror 24 is made to oscillate within a plane parallel to the XY plane by means of a mirror drive apparatus 29. As a result, the image of slit 12A formed on receiving aperture plate 26 by objective lens 23 traverses slit 26A of receiving aperture plate 26. Detector 28 detects light passing through slit 26A and condenser lens 27. The displacement of surface W (i.e., the location of detection location 100) is detected using a synchronous detection technique employing a computational apparatus (not shown) internal to a controller 51, to be described below, based on a photoelectric detection signal from detector 28.

Note that while the above-described preferred embodiment employs oscillating mirror 24 and use of synchronous detection, as is illustrated in FIG. 1, the present invention is not so limited. For example, the average location of surface W can be determined if receiving aperture plate 26, condenser lens 27, and detector 28 are eliminated, and a CCD or other such image detector is electrically connected to the computational apparatus (not shown) internal to controller 51 is disposed at the location of receiving aperture plate 26. In such a case, oscillating mirror 24 is simply employed as a fixed mirror for deflecting the optical path.

With continued reference to FIG. 1, projection exposure apparatus 5 further includes a surface inclination detection apparatus (hereinafter, "auto-leveling system") AL1 for measuring inclination of the surface W relative to a reference surface. Auto-leveling system AL1 is disposed adjacent projection lens PL and includes an optical fiber 110 with an end 110E which guides light to be used for illumination from a light source such as, for example, a halogen lamp (not shown). Optical fiber 110 is arranged so that light is emitted from fiber end 110E in a direction substantially parallel to the Z-axis along an optical axis Ax.

Auto-leveling system AL1 further includes, in order from fiber end 110E along optical Ax, a condenser lens 111, a plate 112 with a slit-shaped aperture ("slit") 112A, and a mirror 113 which reflects optical axis Ax. Mirror 113 is inclined such that light passing through slit 112A is obliquely incident a detection location 101, on surface W. An objective lens 114 is disposed between mirror 113 and detection location 101. When surface W is aligned with a reference surface such as RS (see FIG. 5) (e.g., the image plane of projection lens PL), plate 112 and the surface of surface W are optically conjugate so that an image of slit 112A is formed at detection location 101. Objective lens 114 is image-side telecentric (i.e., telecentric on the side of surface W). With reference to FIG. 3, the light source (not shown), which supplies light to optical fiber 110 which guides the light from the light source to condenser lens 111, constitute a light source unit LSU. Components 111–114 constitute illumination optical systems IOS2 (see FIG. 3). In a preferred embodiment, the light source is polychromatic.

As was described above with respect to autofocus system AF, in auto-leveling system AL1 the preferred orientation of the long axis of slit 112A is such that its image is parallel to the $X_1$ axis, thereby forming an angle of, for example, approximately 45 degrees with the horizontal and vertical lines of the pattern formed on surface W.

When light emanating from fiber end 110e illuminates first detection location 101, the reflected light is captured by a re-illumination optical system, described below, which redirects light reflected from detection location 101 to a detection location 102.

Figure 4:
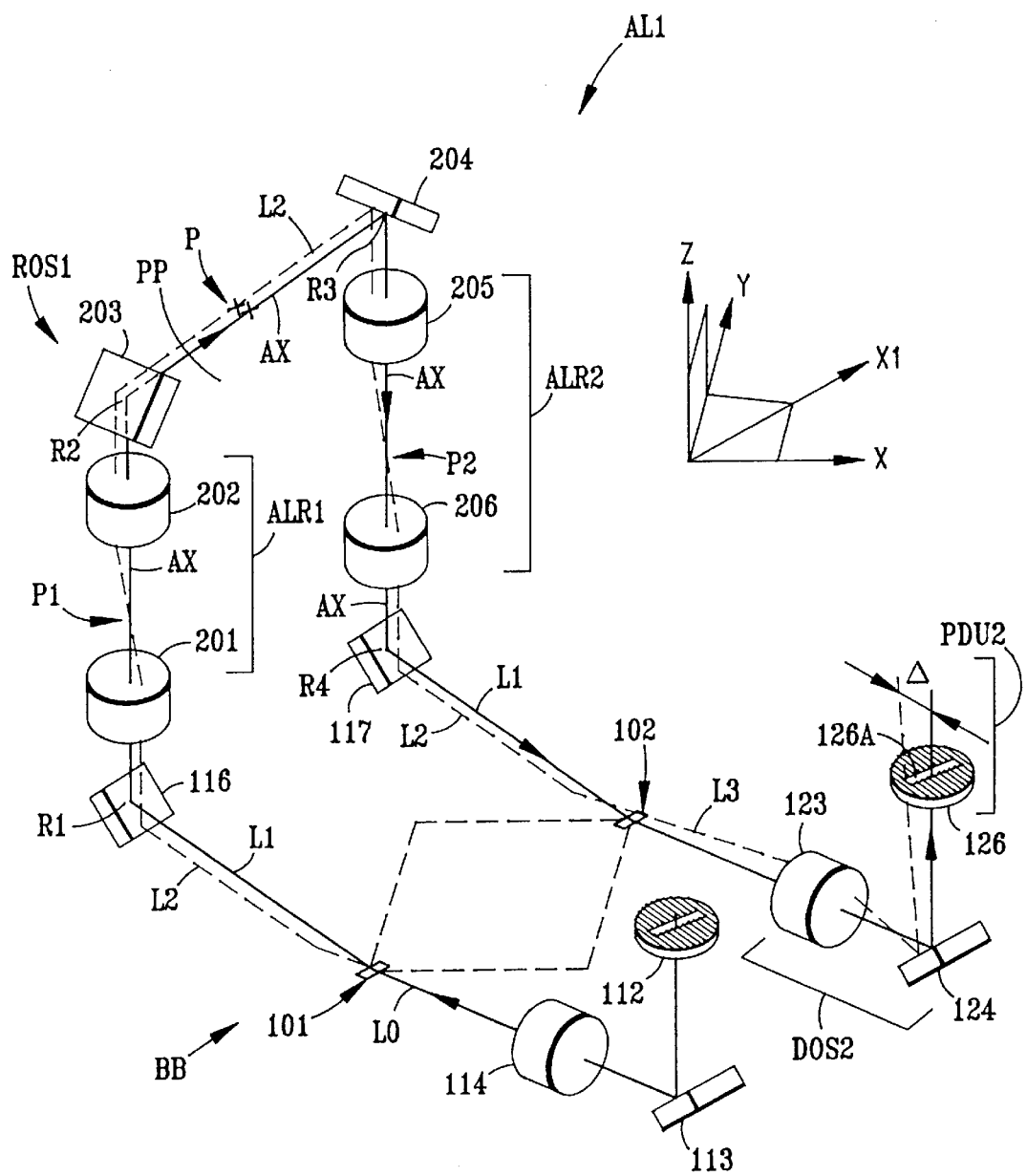
FIG. 4 is a perspective view of the surface position detection apparatus of the present invention shown in FIG. 1, but only showing the components comprising the surface inclination detection apparatus.

With reference to FIGS. 1, 3 and 4, re-illumination optical system ROS1 comprises a mirror 116, which reflects light reflected from first detection location 101 in a direction substantially parallel to the Z-axis, and a first relay lens group ALR1 comprising relay lenses 201 and 202. Relay lens group ALR1 is arranged such that the front focus thereof is located at the reference surface (e.g., reference surface RS; see FIG. 5) associated with surface W (i.e., the location of detection location 101 when the surface W is aligned with the reference surface). Re-illumination optical system ROS1 further includes a mirror 203, which reflects light passing through first relay lens group ALR1 in a direction parallel to the $X_1$-direction, a mirror 204, which reflects light reflected by mirror 203, so that the light is again traveling in a direction substantially parallel to the Z-axis, and a mirror 204, which redirects the light substantially along the Z-axis in the negative direction. Also included downstream from first relay lens group ALR1 is a second relay lens group ALR2, comprising relay lenses 205 and 206, which relays an image formed at an intermediate image plane P, and a fourth mirror 117, which reflects light that has passed through second relay lens group ALR2 and directs it towards detection location 102.

In a preferred embodiment, relay lens groups ALR1 and ALR2 each have unit magnification, and the magnification of re-illumination optical system ROS1 as a whole is substantially unity.

With reference to FIG. 4, first relay lens group ALR1 includes a pupil P1 between relay lenses 201 and 202 at the back focus of relay lens 201 (or the front focus of relay lens 202). Also, second relay lens group ALR2 includes a pupil P2 between relay lenses 205 and 206 at the back focus of relay lens 205 (or the front focus of relay lens 206). In addition, as mentioned above, an intermediate image plane P is located between relay lens groups ALR1 and ALR2. Moreover, when surface W is aligned with the reference surface, intermediate image plane P will be located at the back focus of relay lens 202 (or first relay lens group ALR1). In other words, intermediate image plane P will be located at the front focus of relay lens 205 (or second relay lens group ALR2).

Furthermore, first relay lens group ALR1 is configured such that the front focus of first relay lens group ALR1 will be aligned with the reference surface associated with the surface (i.e., the location of detection location 101 when the surface W is aligned with the reference surface), and the back focus of first relay lens group ALR1 will be aligned with the front focus of second relay lens group ALR2, when the surface W is aligned with the reference surface. In addition, second relay lens group ALR2 is configured such that the back focus of first relay lens group ALR1 will be aligned with the front focus of second relay lens group ALR2, and the back focus of second relay lens group ALR2 will be aligned with the reference surface associated with the surface W (i.e., the location of detection location 102 when the surface W is aligned with the reference surface), when the surface W is aligned with the reference surface. Accordingly, re-illumination optical system ROS1 is telecentric with respect to both first detection location 101 side (object side) and detection location 102 side (image side).

Next, when detection location 102 is illuminated by re-illumination optical system ROS1, light reflected from detection location 102 will be incident on the detection optical system DOS2, described above, which images light reflected from detection location 102 onto plate 126. I.e., the image of slit 112A is re-imaged by re-illumination optical system ROS1 onto detection location 102, and then re-imaged by detection optical system DOS2 onto plate 126. With reference to FIG. 4, when surface W is aligned with the reference surface (e.g., the image plane of projection lens PL, or surface RS in FIG. 5), detection optical system DOS2 maintains detection location 102 and plate 126 in an optically conjugate relationship.

With reference to FIGS. 1, 3 and 4, detection optical system DOS2 comprises objective lens 123, disposed such that its front focus is located at the reference surface associated with the surface W (i.e., the location of detection location 102 when the surface W is aligned with the reference surface). Detection optical system DOS2 further includes an oscillating mirror 124, which reflects light from objective lens 123 in a direction parallel to the Z-axis. Objective lens 123 is telecentric with respect to the detection location 102 side (object side) thereof.

Auto-leveling system further includes a photoelectric detection unit PDU2 which photoelectrically detects the displacement of the light, and is located downstream from mirror 124. Photoelectric detection unit PDU2 comprises plate 126 with slit 126A, an objective lens 127, and a detector 128. Objective lens images slit 126A onto detector 128, which photoelectrically converts light into an electrical signal. Plate 126 is disposed such that the long axis of slit 126A is aligned with the long axis of the image of slit 112A formed on plate 126.

With reference to FIGS. 1, 3 and 4, the operation of auto-leveling system AL1 is now described. Oscillating mirror 124 is made to oscillate within a plane parallel to the XY plane by means of mirror drive apparatus 129. Due to the movement of oscillating mirror 124, the image of slit 112A formed on plate 126 traverses slit 126A of plate 126. Detector 128 detects light passing through slit 126A and condenser lens 127. In this manner, the inclination (the difference in XY position between detection location 101 and detection location 102) of the surface W is detected. A preferred method, described further below, uses a synchronous detection technique employing a computational apparatus (not shown) internal to controller 51 based on a photoelectric detection electronic signal from detector 128. Again, for the same reasons discussed above, the present invention is not limited to inclination detection using the oscillating mirror technique.

Next, referring to FIGS. 1, 3 and 4, the operation of a preferred embodiment of the present invention is described. Prior to exposure of reticle R by illumination system 9, surface W is moved in translational fashion along the Z-axis, aligning it to a prescribed location, as a result of measurement of the displacement of the surface W by autofocus system AF. Then, surface W is set perpendicular to the optical axis of projection lens PL (i.e., aligned with the image plane of projection lens PL) based on the inclination of surface W as detected by the AL system. Then, the pattern within the frame F on reticle R is illuminated with illumination system 9 and projected and exposed by means of projection lens PL, onto surface W, which is placed at a location conjugate to reticle R.

As mentioned above, a controller 51 is provided for controlling the driving of stage ST through drive apparatus STD in correspondence with values detected by autofocus system AF. Controller 51 receives signals from detector 28, and sends control signals to stage drive apparatus STD and adjusts the Z-position of stage ST. Controller 51 also likewise controls the driving of drive apparatus STD in correspondence with values detected by the auto-leveling system AL so as to adjust the inclination of stage ST. Controller 51 receives signals from detector 128, which are analyzed by a computational apparatus (the details of which are not shown) that computes the difference between the displacements at detection locations 101 and 102. Control signals are sent from controller 51 to stage drive apparatus STD based on this difference computation.

Referring still to FIGS. 1, 3 and 4, further description of the operation autofocus system AF is now provided. Light from a light source (not shown), is captured by optical fiber 10, which illuminates transmitting aperture plate 12 via condenser lens 11. An image of slit 12A is formed at detection location 100 on surface W via objective lens 14. Light is reflected off surface W at detection location 100 and is reimaged onto receiving aperture plate 26 by objective lens 23. Since mirror 24 is an oscillating mirror, the reimaged image of slit 12A traverses slit 26A. Light which has passed through slit 26A is imaged onto a detector 28 by condenser lens 27. In this way, the relative displacement of detection location 100 (ordinarily the center of an exposure field or the center of projection of a substrate) on surface W is detected.

Next, with reference still to FIGS. 1, 3 and 4, further description of the operation of auto-leveling system AL1 is provided. As with autofocus system AF, described above, light from a light source (not shown) is captured by optical fiber 110, which illuminates plate 112 via condenser lens 111. An image slit 112A is formed at detection location 101 on surface W via objective lens 114. Light is reflected off surface W at detection location 101 and is reimaged onto detection location 102 by first and second relay lens groups ALR1 and ALR2. The slit image reflected off surface W at detection location 102 and passes through objective lens 123, is reflected at oscillating mirror 124, and is imaged onto plate 126. Light transmitted through slit 126 is imaged onto detector 128 by condenser lens 127.

The reason for employing oscillating mirrors 24 and 124 in the above-described embodiments is to permit phase detection based on the principle of the so-called photoelectric microscope. Controller 51 carries out phase detection of the electrical signals output from detectors 28 and 128 at the frequency at which mirror drive apparatuses 29 and 129 cause mirrors 24 and 124 to oscillate.

Figure 5:
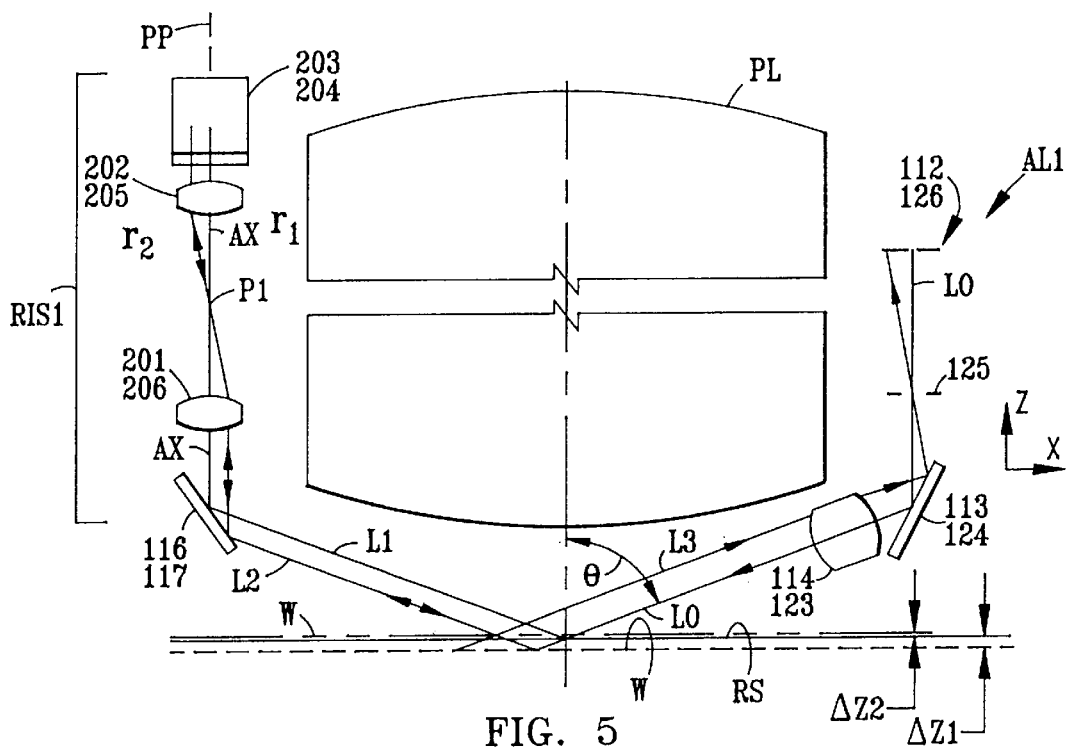
FIG. 5 is a side view of the surface inclination detection apparatus of the present invention of FIG. 4, as viewed in the direction of arrow BB in FIG. 4.

Referring now to FIGS. 4 and 5, the principle by which the difference between displacements in the direction of the Z-axis at the detection locations 101 and 102 is optically detected by an auto-leveling system AL1 is now described. FIG. 4 is a perspective view in which autofocus system AF of FIG. 1 has been eliminated and only auto-leveling system AL1 is shown. Also in FIG. 4, only the components from plate 112 to plate 126 are shown. A solid line is used to indicate principal ray L1 (hereinafter, "reference ray"), which proceeds along the optical axis Ax of re-illumination optical system ROS1 in the direction indicated by the arrows positioned along the reference ray. A dotted line is used to indicate principal ray L2, which is laterally offset from reference ray L1 due to the fact that detection location 101 has been moved by an amount $\Delta Z1$ (see FIG. 5) in the negative Z-direction (i.e., downward). A dashed line is used to indicate principal ray L3, which is laterally offset from reference ray L1 due to the fact that detection location 102 has been moved by an amount $\Delta Z2$ (see FIG. 5) in the positive Z-direction (i.e., upward). A principal ray L0 is associated with the light leaving illumination optical system IOS2.

With reference to FIGS. 4 and 5, an image of plate 112 is formed at detection location 101 on surface W by objective lens 114. The solid line at the surface W surface in FIG. 5 indicates the reference surface RS. There is no change in the location of the image of slit 112A on plate 126 when the surface W is aligned with reference surface RS.

Next, if detection location 101 on surface W is shifted by an amount $\Delta Z1$ in the negative direction (i.e., downward) with respect to the reference surface, then principal ray L0 associated with the light striking detection location 101 will become reflected principal ray L2 which travels along the optical path indicated by the dotted line in FIGS. 4 and 5. Principal ray L2, having been reflected at detection location 101, is reflected at a location on first mirror 116 that is lower than reference ray L1 (solid line), and is incident on relay lens 201. That is, movement of detection location 101 in the negative Z direction causes principal ray L2 to be incident on relay lens 201 toward the surface W side of the reference ray. In the present invention, re-illumination optical system ROS1 can be thought of as being divided into two regions on either side of a prescribed plane PP (see FIGS. 4 and 5) containing the optical axis Ax between mirrors 116 and 117, and the points R1–R4 on mirrors 116, 203, 204 and 117, respectively.

R1–R4 are the reflection points at mirrors 116, 203, 204 and 117, respectively, of reference ray L1, when the surface W is aligned with the reference position. Accordingly, the prescribed plane PP, indicated in FIGS. 4 and 5, is in a plane perpendicular to the plane of the paper in FIG. 5.

Principal ray L2, upon passing through relay lens 201, intersects optical axis Ax (and hence plane PP) at the location of the pupil P1. Thereafter, principal ray L2 crosses over into the second region defined by prescribed plane PP, and passes through relay lens 202, whereupon it is reflected at second mirror 203, and intersects image plane P, where an image of slit 112A is formed. Note that image plane P is orthogonal to prescribed plane PP. From image plane P, principal ray L2 is reflected off mirror 204, intersects optical axis Ax at the location of pupil P2 of relay lens 205, passes through relay lens 206, is reflected at mirror 117, and is incident on detection location 102.

With reference to FIGS. 4 and 5, if detection location 102 on the surface W is shifted by an amount $\Delta Z2$ in the positive direction (i.e., upward) with respect to the reference surface, then principal ray L2 exiting re-illumination optical system ROS1 and reflected at detection location 102 will become principal ray L3 (dashed line). Principal ray L3, having been reflected at detection location 102, then passes through objective lens 123 and is reflected by mirror 124. The displacement of the image of slit 112A at plate 126 corresponds to the difference in the displacement of the surface W in a direction normal to the reference surface at the detection locations 101 and 102.

Therefore, as shown at FIG. 5, prescribed plane PP will be orthogonal with respect to the plane of incidence at reference surface RS associated with the principal ray L0 of the light beam incident on detection location 101 when the surface W is displaced with respect to the reference surface RS by an amount $\Delta Z1$ or $\Delta Z2$.

Accordingly, re-illumination optical system RS is configured such that when surface W is displaced with respect to the reference surface by an amount $\Delta Z$, principal ray L2 is reflected from detection location 101, and is directed toward one of the two regions (see FIG. 5) into which re-illumination optical system ROS1 is split a prescribed plane PP and within re-illumination optical system ROS1, crosses over into region $r_2$ at pupil P1. Principal ray L2 then crosses back into region $r_1$ at pupil position P2, and is directed toward detection location 102 by relay lens 206 and mirror 117.

Such an arrangement of re-illumination optical system ROS1 results in a displaced image of slit 112A at plate 126 which corresponds to the difference in displacement of the surface W in a direction normal to the reference surface at detection locations 101 and 102. In this regard, it is preferable that relay lens 201 and relay lens 202 be arranged so as to be telecentric with respect to both sides thereof, as doing so will allow relay lens 202 and the lenses following it to be relatively compact.

It should be noted that it is not necessary that the respective relay lens groups in the present invention be of unity magnification. What matters is that the magnifications be set so as to produce unity magnification between detection location 101 and detection location 102. Also, though it is not necessary that relay lenses 205 and 206 be doublesided telecentric, it is preferable that they be so, for the reasons discussed above. Also, in a preferred embodiment, it is desirable that there be telecentricity with respect to the detection location 101 side and the detection location 102 side because it is desirable that the angle of incidence (or angle of reflection) θ of the principal rays at detection location 101 be the same as the angle of incidence (or angle of reflection) at detection location 102.

As shown is FIGS. 4 and 5 and as described above, principal ray L2 is directed toward one of two regions $r_1$ or $r_2$ into which re-illumination optical system ROS1 is split by prescribed plane PP. Principle ray L2 enters re-illumination system ROS1 in region $r_1$, crosses over into region $r_2$, then back into region $r_1$, and then exits the re-illumination optical system ROS1, and heads toward detection location 102. If surface W is shifted by an amount ΔZ2 in the direction of the Z-axis (upward in the drawing) at detection location 102, then principal ray L3 will be incident on objective lens 123 off-axis. Principal ray L3, having passed through objective lens 123 off-axis, is reflected at mirror 124, and is imaged onto plate 126 at a location displaced by an amount Δ from the location of the image of slit 112A thereon when the surface W is at the reference position (see FIG. 4). In FIG. 5, an aperture stop 125 is shown between mirror 124 and plate 126.

With reference to FIG. 5, in the case where detection location 102 is shifted downward with respect to the reference position by the same amount ΔZ1 as at detection location 101, principal ray L2 travels along the same optical path as reference ray L1. Thus, there is no change in the location at which the image of slit 112A is formed on plate 126. That is, because detection locations 101 and 102 were shifted by equal amounts, no inclination results therefrom, and there is therefore no displacement in the location of the image of slit 112A on plate 126.

As described above, employment of relay lens groups ALR1 and ALR2, of magnification unity or otherwise, and mirrors 116, 117, 203, and 204 permits detection of the relative displacement Δ of detection location 102 (ΔZ2) with respect to detection location 101 (ΔZ1) (see FIG. 4). The relative displacement Δ is given by the following formula:

$$\Delta = 2 \times \sin \theta \times (\Delta Z1 - \Delta Z2) \times \beta,$$

wherein θ is the angle of incidence of the principal light rays, and β is the magnification of objective lens 123 between detection location 102 and slit 126A. Incident angle θ is typically between 70 to 80 degrees. Detection of the displacement at detection location 100 using autofocus system AF, described above, and detecting the relative displacement Δ between detection location 101 and detection location 102 makes it possible to correct both the surface inclination and displacement of surface W by making it parallel or co-planar with reference surface RS.

Figure 6:
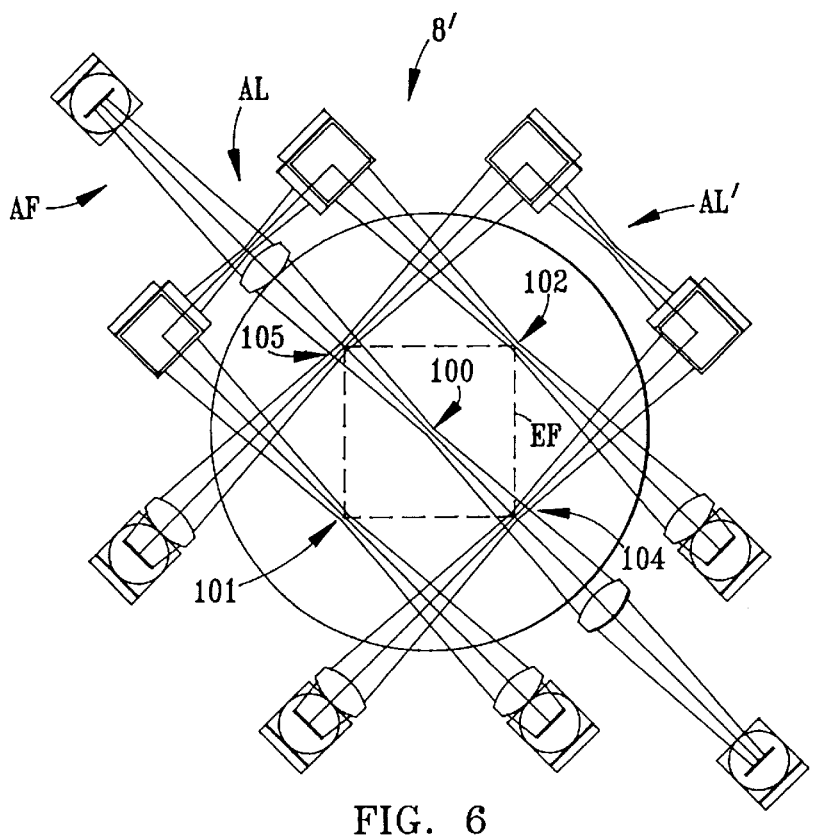
FIG. 6 is a plan view of a preferred embodiment of the surface inclination detection apparatus of the present invention, which includes a second surface inclination detection apparatus.

FIG. 6 shows a plan view of another preferred embodiment of position detection system 8' of the present invention, which includes two auto-leveling systems AL and AL', and an autofocus system AF. In the preceding embodiment, because the three detection locations 100, 101, and 102 are in a line, it is not possible to set the inclination of surface W in a direction orthogonal to that line. However, in the embodiment shown at FIG. 6, in addition to the aforementioned auto-leveling system AL, there is provided an auto-leveling identical system AL' possessing detection locations 104, 105 lying in a direction orthogonal to a line drawn between the detection locations 101 and 102. Accordingly, the four detection locations 101, 102, 103, 104 are arranged on surface W so as to be located at the vertices of exposure field EF, permitting determination of the inclination of surface W in every direction.

In the preferred embodiment shown in FIG. 6, by controlling the inclination of the substrate so as to cause relative displacement Δ at plate 126 (see FIG. 4) for each pair of detection locations to be zero, and by determining the Z-displacement of central detection location 100 and carrying out controlled movement of substrate in the Z-direction using autofocus system AF, it is possible to focus the center of exposure field EF and also correct inclination of surface W in any direction. It is possible to constantly measure the displacement of detection location 100 at the center of the exposure field EF and the difference in displacements at pairs of points 101–105 at the vertices of exposure field EF, and therefore detect the inclination component of surface W with no delay in time, and during exposure of exposure field EF.

Figure 7:
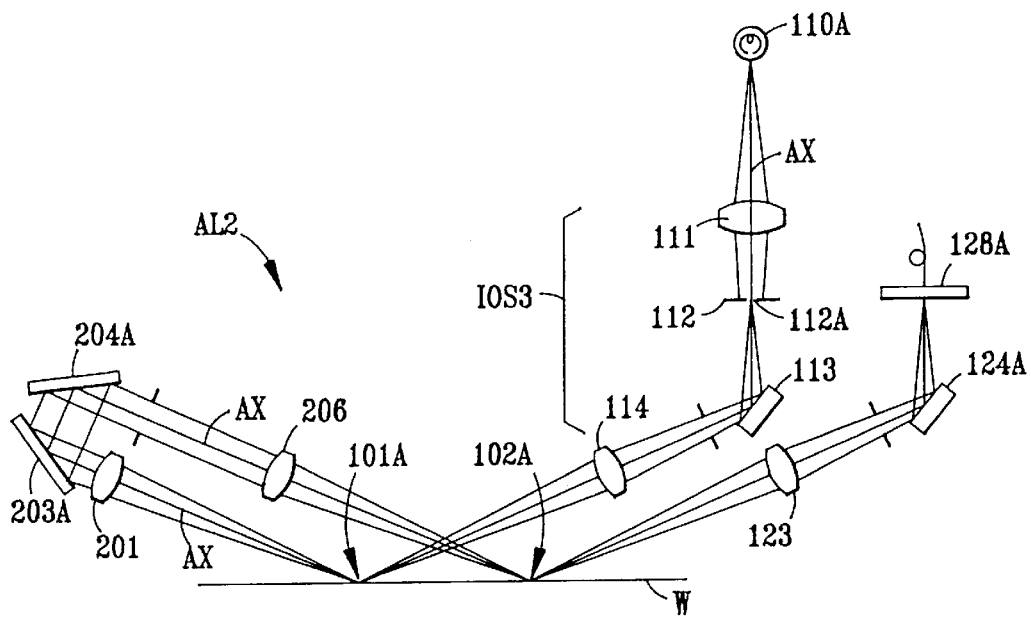
FIG. 7 is a side view of a preferred embodiment of the surface inclination detection apparatus of the present invention.

FIG. 7 is yet another preferred embodiment of the auto-leveling system of the present invention. The embodiment illustrated therein is well-suited when the field of detection is comparatively small, and does not possess the intermediate image point P of the relay system of the preceding embodiments. The configuration of auto-leveling system AL2 shown in FIG. 7 is advantageous also from standpoint of spatial design because it is compact.

Auto-leveling system AL2 comprises, in order along optical axis Ax, a light source 110A such as, for example, a halogen lamp, a condenser lens 111, a plate 112 with a slit-shaped aperture ("slit") 112A, and a mirror 113. Mirror 113 is inclined so that light passing through slit 112A is obliquely incident at detection location 101A on the surface W. An objective lens 114 is disposed between mirror 113 and detection location 101A such that plate 112 and detection location 101A are conjugate. An illumination optical system IOS3 of the present embodiment comprises the aforementioned components 111–114. Plate 112 is arranged such that the long axis of the image of slit 112A at detection location 101A forms an angle of, for example, 45 degrees relative to the horizontal and vertical lines of the pattern on surface W, for the reasons discussed above in connection with the preceding embodiments.

With continuing reference to FIG. 7, auto-leveling system AL2 further includes, disposed in order along optical axis Ax from detection location 101A, a relay lens 201, a mirror 203A which reflects optical axis Ax (e.g., by 90 degrees), a mirror 204A which further reflects optical axis Ax (e.g., by 90 degrees) such that it is parallel to the section of optical axis Ax passing through relay lens 201. This causes the existing relay lens 206 to direct light be obliquely incident on detection location 102A on surface W. Relay lens 206 is arranged between mirror 204A and detection location 102A so that, in combination with relay lens 201, detection location 101A and detection location 102A are conjugate.

Continuing with reference to FIG. 7, auto-leveling system AL2 further includes objective lens 123 and a deflecting mirror 124A which reflects optical axis Ax in a direction parallel to the Z-direction. A detector 128A is located at a position conjugate to detection location 102A. Detector 128A may be, for example, a CCD, line sensor, TDI or other such light-sensitive device or element capable of converting light energy into an electrical signal.

Plate 112 is arranged so that the long axis of the image of slit 112A is orthogonal to optical axis Ax at detection location 101A. Also, the aforementioned optical components are arranged such that the image of slit 112A at detection location 102A is parallel to, and removed by a certain distance in a direction orthogonal to the long axis from, the image of slit 112A formed at detection location 101A.

Also in a preferred embodiment, an oscillating mirror and photoelectric microscopic detection method are used, as described above in connection with the preceding embodiments.

In the preferred embodiment of the auto-leveling system AL2 present invention shown in FIG. 7 and described immediately above, an image of slit 112A is formed by illuminating plate 112 with light source 110A via condenser lens 111. This image is obliquely incident on, and is imaged at, detection location 101A by deflecting mirror 113 and objective lens 114. Light reflected at detection location 101A passes through relay lens 201, is reflected at mirrors 203 and 204, passes through relay lens 206, and is re-imaged on detection location 102A. Relay lenses 201 and 206 are preferably of unity magnification and are telecentric with respect to both the detection location 101A and the detection location 102A side thereof. Light reflected at detection location 102A is imaged onto detector 128 by objective lens 123. The difference between displacements in the direction of the Z-axis at detection location 101A and detection location 102A is detected as displacement of the image of slit 112A at receiving aperture plate 112. This displacement is then detected at detector 128A.

Note that a plurality of the auto-leveling systems AL2 can be configured as shown in FIG. 6. This makes it possible to determine differences in relative displacement at pairs of diagonally opposing points, determine the inclination of the surface W, and carry out compensation therefor. Also, if desired, the two preferred embodiments of the auto-leveling system of the present invention AL1 and AL2, shown in FIGS. 4 and 7, respectively, and discussed above, may both be combined within a single projection exposure apparatus, such as shown in FIG. 1.

Next, referring to FIGS. 8 through 11, another preferred embodiment of the present invention is described. In this preferred embodiment, auto-leveling system AL3 includes first and second detection locations, each of which comprises a plurality of detection locations. The displacements of the surface W at the plurality of detection locations at each first and second detection location are added by means of an auxiliary re-illumination optical system, and it is possible to determine the difference between the added respective values making up each pair of detection locations. Accordingly, because the inclination of the surface W can be determined using the average of the displacements at the plurality of detection locations, displacement detection error due to local conditions at respective detection locations is alleviated.

Figure 8:
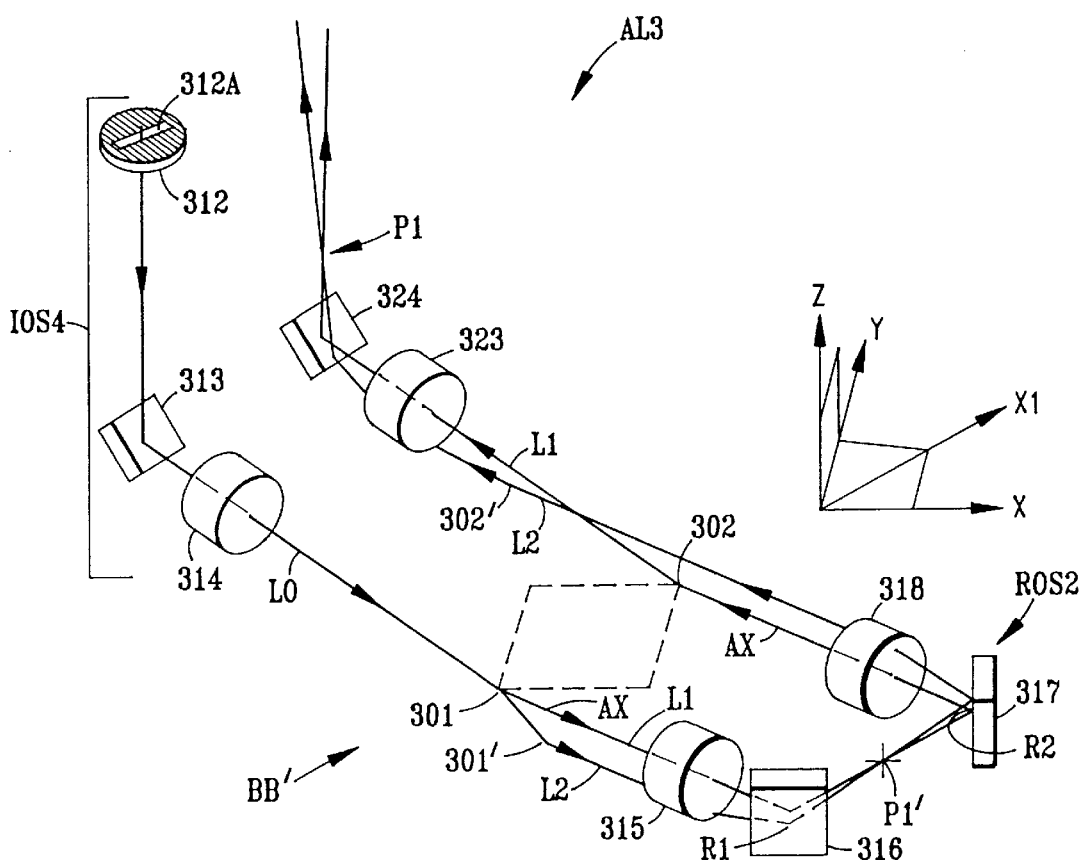
FIG. 8 is a perspective view of a preferred embodiment of the surface inclination detection apparatus of the present invention which determines the sum of displacements at the detection locations.

Referring now to FIG. 8, auto-leveling system AL3 is similar to that of FIG. 1 and comprises, in order along optical axis Ax, a plate 312 with a slit-shaped aperture ("slit") 312A, a mirror 313 inclined so that light passing through slit 312A is obliquely incident at detection location 301 on the surface W. An objective lens 314 is arranged between mirror 313 and detection location 301 such that plate 312 and detection location 301 are conjugate. A relay lens 315 is arranged opposite objective lens 314 such that detection location 301 lies in the focal plane of objectives lens 314. Downstream from relay lens 315 is a mirror 316, which reflects optical axis Ax parallel to the $X_1$ axis, and a mirror 317, which further reflects optical axis Ax. A relay lens 318 is arranged between mirror 317 and detection location 302. Detection location 301 and detection location 302 are conjugate with respect to relay lens 315 and relay lens 318. Detection location 302 is set such that the long axis of the image of slit 312A at detection location 302 is aligned with the long axis of the image of slit 312A at detection location 301. Disposed downstream of detection location 302 is a relay lens 323 and a mirror 324.

In the configuration shown in FIG. 8, and described above, light passing through slit 312A is imaged on detection location 301 by way of relay lens 314. Light reflected thereat is re-imaged onto detection location 302 by means of relay lens 315, mirror 316, mirror 317, and relay lens 318. Moreover, the image of slit 312A, having been reflected at detection location 302, is relayed to a detector (not shown) by way of relay lens 323 and mirror 324.

Figure 9:
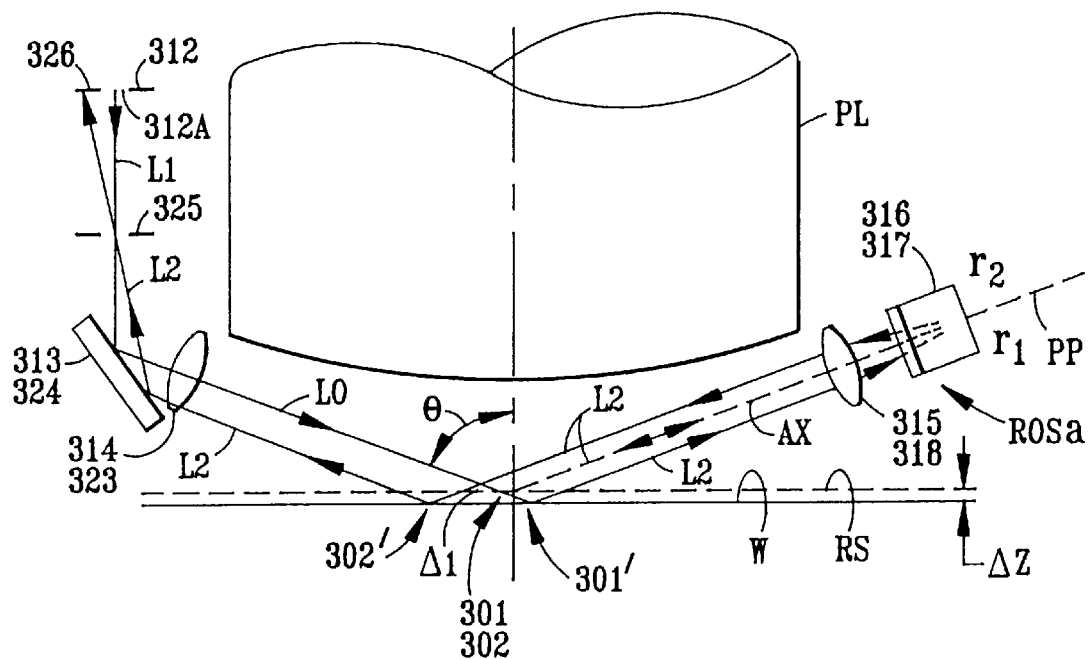
FIG. 9 is a side view of the surface inclination detection apparatus of FIG. 8 along the direction of the arrow BB'.

Referring now to FIGS. 8 and 9, the manner in which the displacements at detection locations 301, 301', 302 and 302' are optically added is described. FIG. 8 shows auto-leveling system AL3 from plate 312 to mirror 324, wherein the arrows along light rays L0–L2 indicate the direction of light propagation. A solid line is used to indicate principal ray L1 (hereinafter, "reference ray") proceeding along the optical axis Ax. Note that principal ray L2 (dashed line) is offset from principal ray L1 (solid line). The principal ray L0 represents light delivered from the illumination optical system IOS4, which comprises plate 312, mirror 313 and objective lens 314. With reference to FIGS. 8 and 9, components 315–318 shown at FIGS. 8 and 9 constitute a re-illumination optical system ROS2 for relaying light from detection locations 301 and 301' to detection locations 302 and 302'.

With reference to FIG. 9, the image of slit 312A is imaged at detection location 301 on surface W by objective lens 314. FIG. 9 illustrates the case where surface W has been moved downward by an amount ΔZ relative to reference surface RS. When light is reflected off of surface W while it is in the reference position, there will be no change in the location of the image of slit 312A formed on plate 326. In other words, principal rays L0 and L2 will coincide. Next, if surface W is shifted downward by an amount ΔZ, then principal light ray L0 striking detection location 301 will become principal ray L2 and the image of slit 312A on plate 326 will shift accordingly. Incident angle θ, as shown in FIG. 9 as the oblique angle of incidence of principle ray L0 and optical axis Ax of the projection lens PL, is typically between 70 and 80 degrees.

With continuing reference to FIG. 9, when surface W is displaced by ΔZ with respect to reference surface RS, principal ray L2 is incident at relay lens 315 at a location below reference ray L1. Thus, principal ray L2 is directed toward region $r_1$ (FIG. 9) on the projection lens PL side of prescribed plane PP, opposite region $r_2$ (FIG. 9). With reference to FIG. 8, prescribed plane PP is defined by the following four points: detection location 301, reflection point R1 at mirror 316, reflection point R2 at mirror 317, and detection location 302 when the surface W is aligned with the reference position. Accordingly, prescribed plane PP in FIG. 9 is the plane which is perpendicular to the plane of the paper and which contains optical axis Ax of re-illumination optical system ROS2. Principal ray 12 passes therethrough, and intersects reference ray L1, and prescribed plane PP at pupil position P1 of relay lens 315. Principal ray L2 then proceeds along a path above reference ray L1, in region $r_2$ and passes through relay lens 318, and arrives at detection location 302 by way of a path still above reference ray L1.

Re-illumination optical system ROS2 is configured such that when surface W is displaced with respect to reference surface RS by an amount ΔZ principal ray L2 from the detection location 301' is relayed to detection location 302'.

Thus, there is a displacement in the image of slit 312A at plate 326 corresponding to the displacements of the surface W in a direction normal to the reference surface detection positions 301 and 302.

In FIG. 9, the Z-axis equivalent displacement $\Delta 1$ at detection location 302 will vary depending on the magnification $\beta$ of re-illumination optical system ROS2, but is equal to $\Delta Z$ when the magnification thereof is unity. Furthermore, if detection location 302 is likewise shifted downward by an amount $\Delta Z$, principal ray L2 will be incident on objective lens 323 at a point determined by addition of the amount of this shift.

When magnification $\beta$ of re-illumination optical system ROS2 is not unity, the shift $\Delta Z$ of detection location 301 will be magnified, making it $\Delta Z \times \beta$, at detection location 302, and moreover, will move in a plane conjugate to detection location 302 with respect to relay lens 323 by this amount plus the $\Delta Z$ from detection location 302, as if a weighting factor had been applied to the value of detection location 301.

Figure 10:
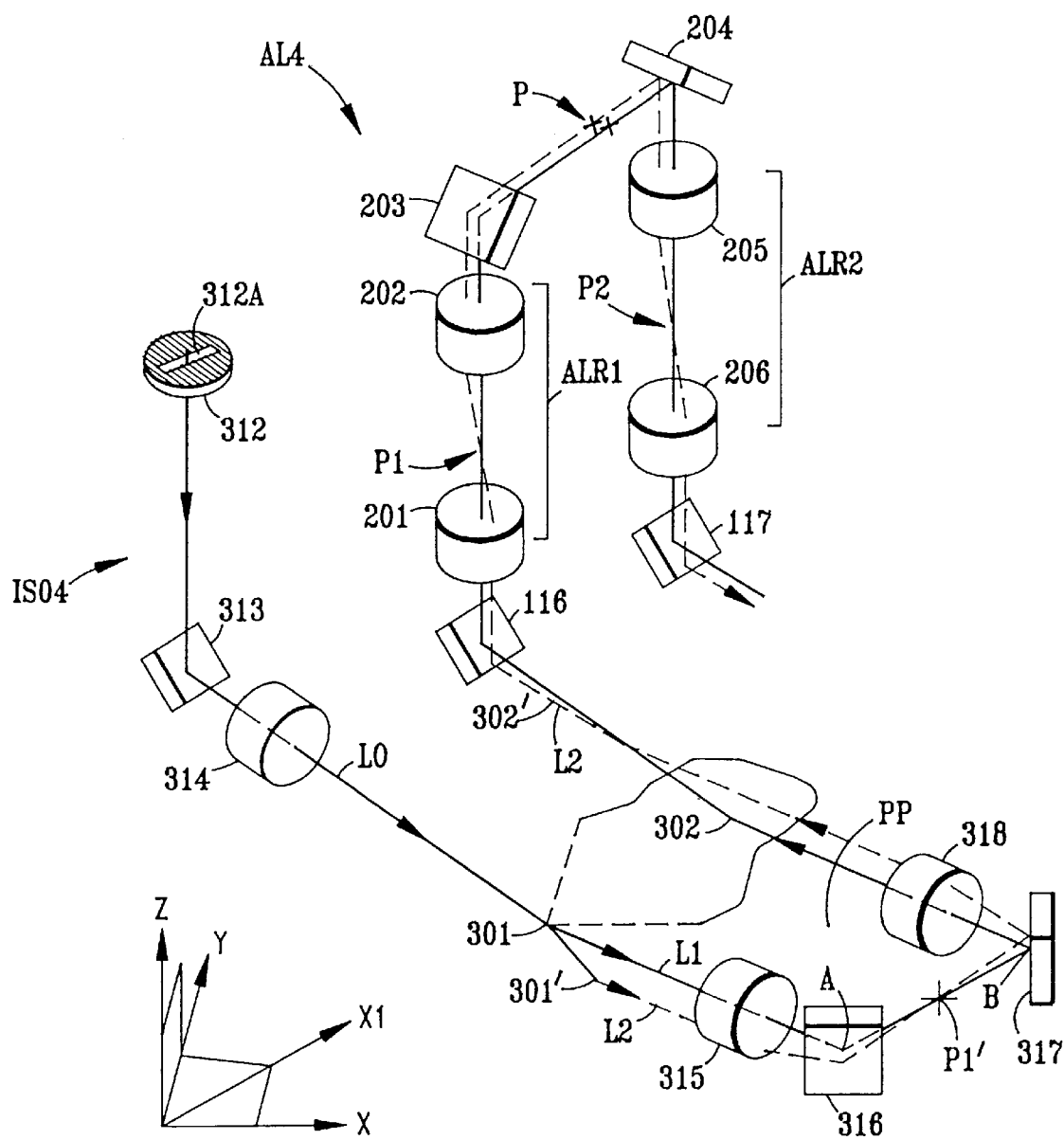
FIG. 10 is a perspective view showing a preferred embodiment of the surface inclination detection apparatus shown at FIG. 8.

FIG. 10 shows another preferred embodiment of the auto-leveling system AL4 of the present invention, wherein the number of optical elements may be increased to permit detection at three or more locations on surface W. Auto-leveling system AL4 shows an optical system which is essentially a combination of auto-leveling systems AL1 of FIG. 4 and AL3 of FIG. 8. Note that relay lens 323 of FIG. 8 corresponds to relay lens 201 of FIG. 10. Also, while mirror 116 is shown mounted between detection location 302 and relay lens 201, it may also be located behind relay lens 323, as shown in FIG. 8 or between relay lens 201 and relay lens 202 in FIG. 10. Furthermore, as mirrors 116 and 117 are for the purpose of making the apparatus more compact, and are unnecessary in terms of function alone, either or both may be omitted.

Figure 11:
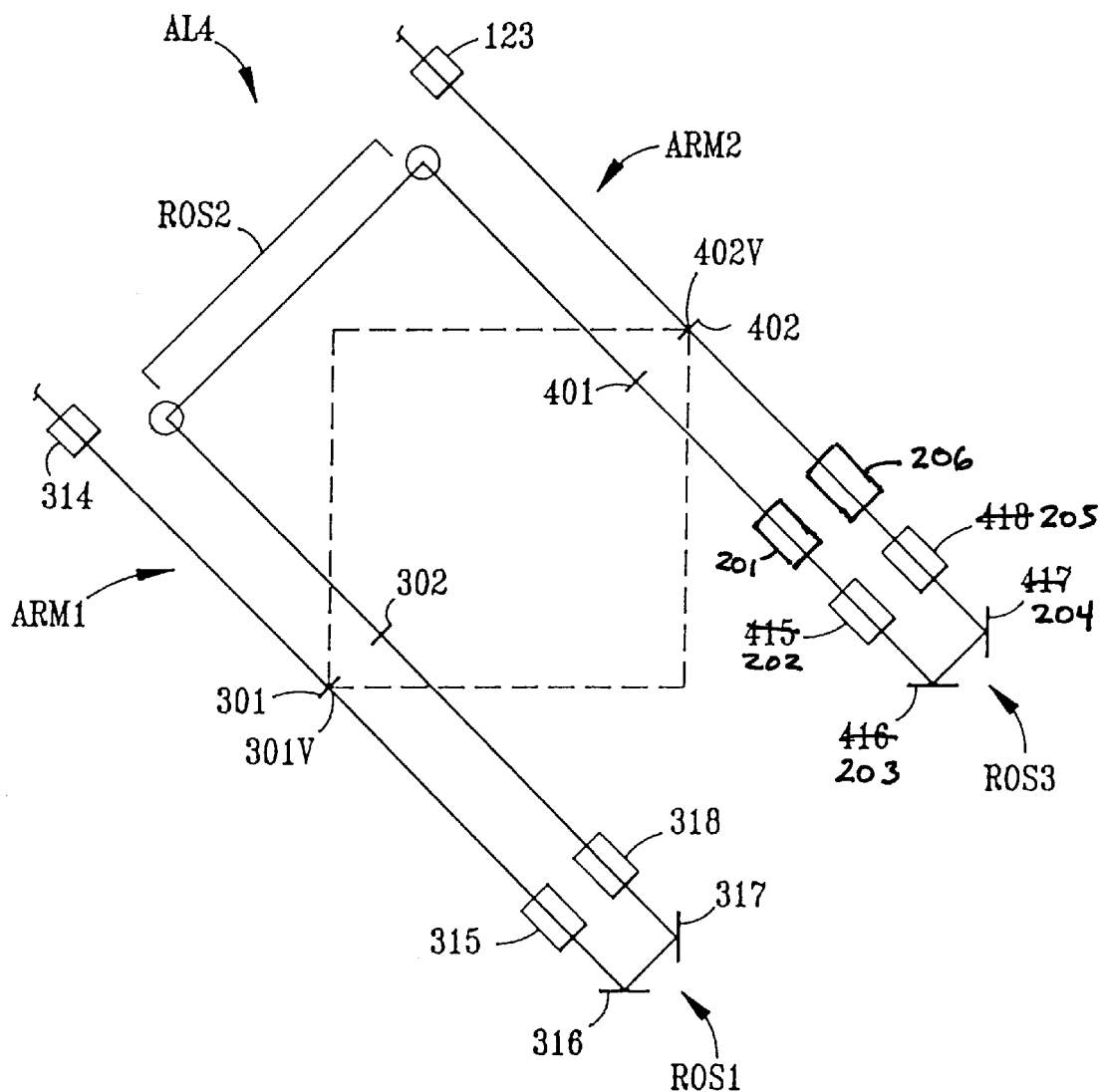
FIG. 11 is a plan view of the surface inclination detection apparatus of FIG. 10.

FIG. 11 is a plan view of auto-leveling system AL4, shown in FIG. 10, as viewed from a direction normal to and above surface W. Auto-leveling system AL4 comprises two auto-leveling arms ARM1 and ARM2, each capable of detecting the sum of displacements at two detection locations, are provided. Auto-leveling arm ARM1 is used to detect the sum of displacements at detection locations 301 and 302 in the vicinity of vertex 301V and auto-leveling arm ARM2 is used to detect the sum of displacements at detection locations 401 and 402 in the vicinity of vertex 402V.

With reference to FIGS. 10 and 11, auto-leveling system AL4 includes an illumination optical system IOS4 comprising components 312–314, detection location 301, and first, second and third re-illumination optical systems, ROS1, ROS2 and ROS3. First re-illumination optical system ROS1, comprising relay lenses 315 and 318 and mirrors 316 and 317, redirects light for detecting the difference in displacements at detection location 302. Second re-illumination optical system ROS2, comprising relay lenses 201, 202, 205, and 206, and mirrors 116, 203, 204, and 117, redirects light to detection location 401. Third re-illumination optical system ROS3 has the same optical structure as second re-illumination optical system ROS2. That is to say, third re-illumination optical system ROS3, comprising relay lenses 201, 202, 205 and 206, and mirrors 203 and 204 redirects light for detecting the sum of displacements at detection location 402 (not shown in FIG. 11). Also included in auto-leveling system AL4 is an objective lens 123 for imaging light from detection location 402 onto a detector (not shown in FIG. 11).

The configuration shown in FIG. 11 permits determination of the difference between the sum of displacements of the surface W at detection locations 301 and 302, and the sum of displacements of the surface W at detection locations 401 and 402. Accordingly, local conditions at the several detection locations in the vicinity of a single detection location are averaged out and alleviated, and accurate determination of the inclination of the surface W is permitted.

To carry out this "weighted" detection of inclination, as described above using first detection location 301 and detection location 302, re-illumination optical systems ROS1 and ROS2 may be configured to cause a displacement in the image of slit 312A at plate 326 (not shown in FIGS. 10 and 11), in an amount corresponding to the respective Z-displacements of the surface W at the two detection locations 301 and 302. Furthermore, to carry out weighted detection of detection location 401 and detection location 402, re-illumination optical systems ROS2 and ROS3 may be configured to cause a Z-displacement in the image of slit 312A at plate 326 (not shown in FIGS. 10 and 11), in an amount corresponding to the respective displacement of the surface W at the two detection locations 401 and 402.

Figure 12:
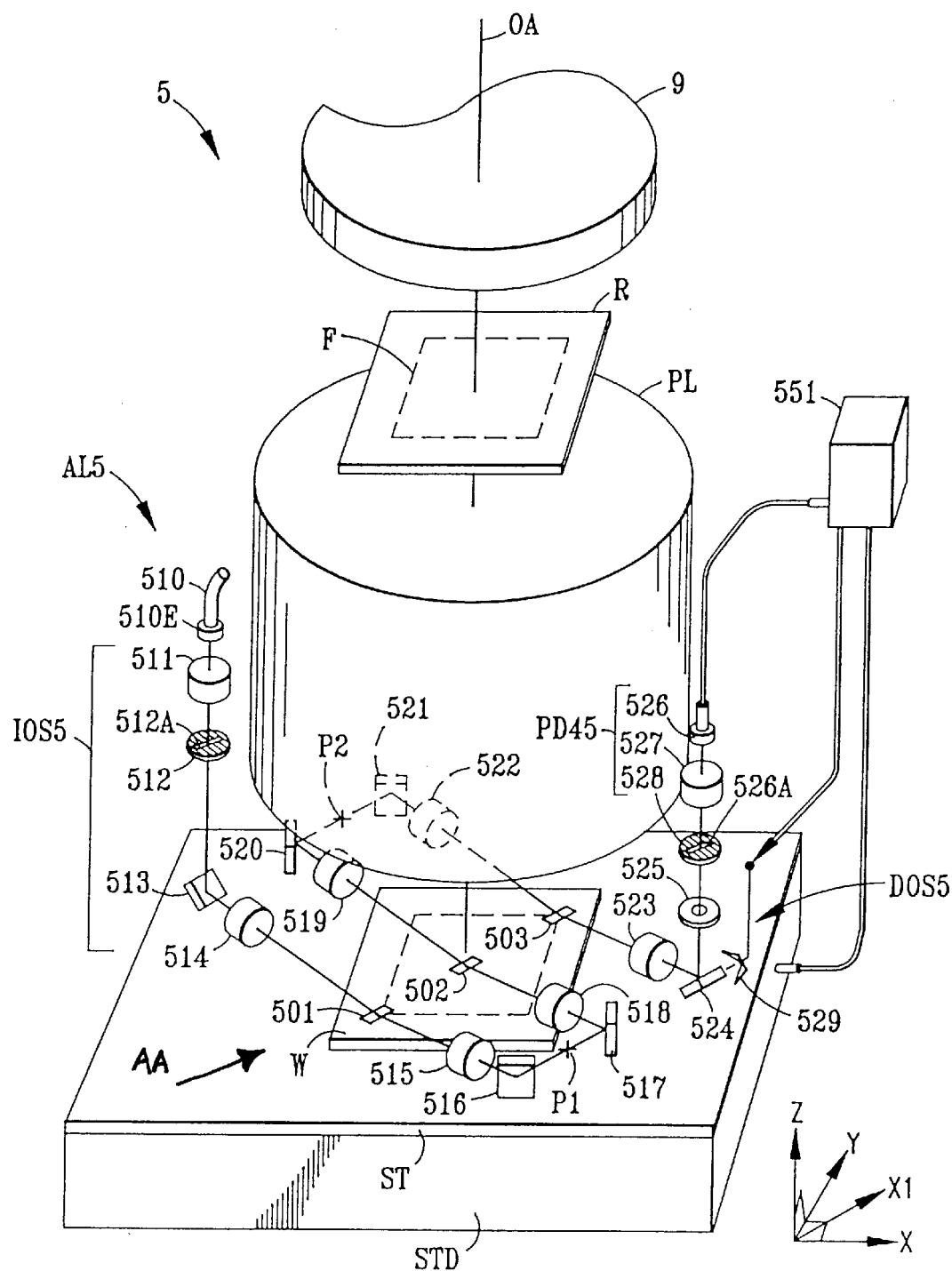
FIG. 12 is a perspective view of a preferred embodiment of the position detection apparatus of the present invention incorporated within a projection exposure apparatus.

With reference now to FIG. 12, another embodiment of the auto-leveling system of the present invention is now described. Projection exposure apparatus 5 is the same as that in FIG. 1 and is discussed above, and auto-leveling system AL5 of the present embodiment is incorporated therewith as described below. Condenser lens 511, light transmitting plate 512 having slit-shaped aperture ("slit") 512A and mirror 513, which is a deflection member, are arranged in that order in the optical path disposed downstream from optical fiber 510 having a fiber end 510E from which light is emitted. Mirror 513 is inclined so that the light from transmitting aperture plate 512 is made to impinge obliquely at detection location 501 on surface W. Objective lens 514 is disposed between mirror 513 and detection location 501.

At this point, if the surface coincides with reference surface RS (see FIG. 16) (e.g., the image plane of protection lens PL). Objective lens 514 maintains plate 512 and surface RS optically conjugate. In addition, objective lens 514 is telecentric with respect to the surface substrate W (side of first detection location). Components 511 to 514 form the illumination optical system IOS5. Furthermore, the light source (not shown) that provides light, and optical fiber 510 that guides the light from light source to condenser lens 511, constitute the light source unit. Also, as mentioned above in connection with the previous preferred embodiments, long axis of slit 512A is arranged so that the long axis of the image of slit 512A at detection location 501 is at an angle (e.g., 45°) with respect to live patterns on surface W.

Figure 13:
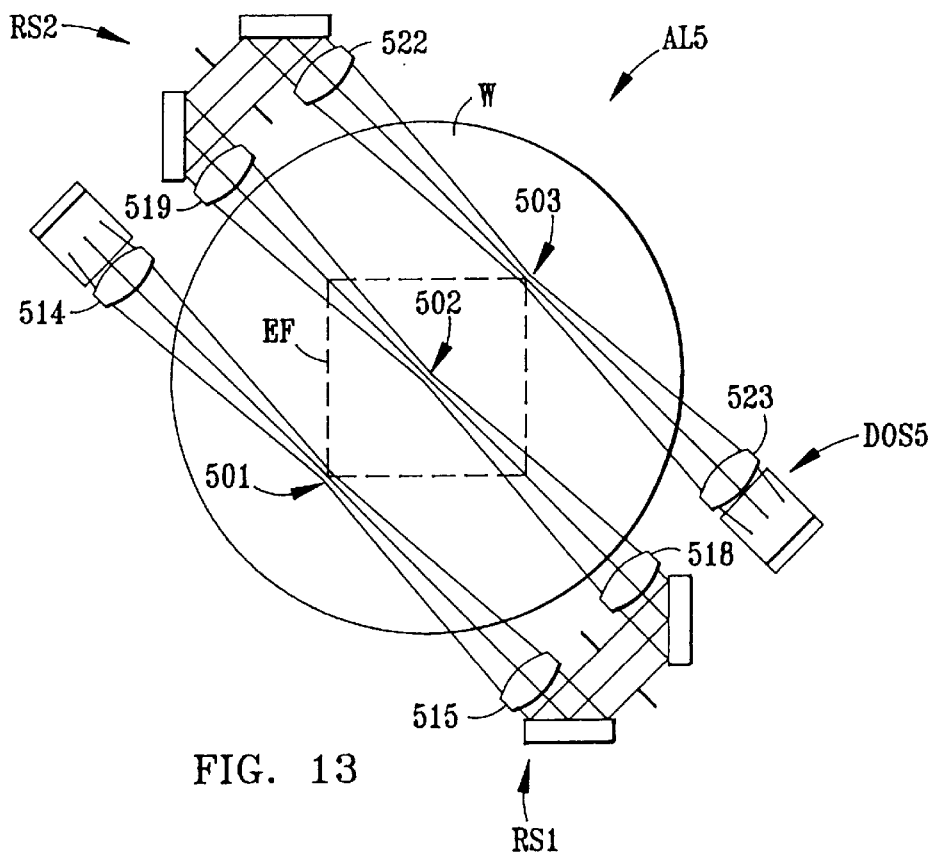
FIG. 13 is a plan view of the position detection apparatus of FIG. 12 as viewed from a point between the projection lens and the substrate.

Referring to FIGS. 12 and 13, if light is incident on detection location 501 by illumination optical system IOS5, the light reflected from that detection location impinges on first relay optical system RS1 (FIG. 13). First relay optical system RS1 includes relay lens 515 that concentrates the light reflected from detection location 501 and forms collimated light, mirror 516 that reflects that collimated light in a direction parallel to $X_1$ (predetermined direction), second mirror 517 that reflects the collimated light reflected by mirror 516 toward detection location 502, and second relay lens 518 that concentrates the collimated light passing through first relay lens 515 and mirrors 516 and 517. RS1 guides the light reflected from detection location 501 to detection location 502. More particularly, relay optical system RS1 is provided obliquely with respect to surface W. Also, the image of slit 512A formed at detection location 501 is relayed (re-imaged) from first detection point 501 to second detection point 502.

If surface W as the object to be detected coincides with a reference surface RS (see FIG. 16), first relay optical system (RS1) maintains first detection location 501 and detection location 502 optically conjugate. Furthermore, first relay optical system RS1 is configured so that the long axis of the image of slit 512A formed at first detection location 501 coincides with the long axis of the image formed of slit 512A at detection location 502. Relay optical system RS1 is arranged so that its front focal point is positioned at the reference surface RS with respect to which surface W coincides. When surface W coincides with reference surface RS, first relay lens 515 is set up so that its front focal point position coincides with reference surface RS with respect to the surface W, as well as so that its rear focal point coincides with the front focal point position of second relay lens 518. In addition, when surface W coincides with reference surface RS, second relay lens 518 is set up so that its rear focal point position coincides with the front focal point position of second relay lens 518, and its rear focal point position coincides with reference surface RS with respect to surface W. Accordingly, first relay optical system RS1 is doubly telecentric.

If second detection location 502 is illuminated by first relay optical system RS1, the light reflected from detection location 502 impinges on second relay optical system RS2 (FIG. 13), which concentrates light reflected from detection location 502 to detection location 503. Second relay optical system RS2 includes third relay lens 519 which concentrates light reflected from detection location 502 and forms collimated light. Mirror 520 reflects this collimated light in a direction parallel to $X_1$. Mirror 521 reflects the collimated light reflected by mirror 520 toward detection location 503. Fourth relay lens 522 concentrates the light passing through relay lens 519 and mirror 520 and 521. Second relay optical system RS2 is provided obliquely with respect to surface W, the same as with first relay optical system RS1.

At this point, the image of slit 512A at first detection location 501 is re-imaged by first relay optical system RS1 to second detection location 502. Further, second relay optical system RS2 has a function to re-image (relay) the image of slit 512A formed at detection location 502 to detection location 503.

If surface W coincides with reference surface RS (see FIG. 16) second relay optical system RS2 maintains detection location 502 and detection location 503 optically conjugate. Furthermore, second relay optical system RS2 is configured so that the long axis of the image of slit 512A formed at detection location 502 coincides with the long axis of the image of slit 512A formed at detection location 503. Also, second relay optical system RS2 is arranged so that its front focal point is positioned at reference surface RS with respect to surface W.

At this point, when surface W coincides with reference surface RS, relay lens 519 is set up so that its front focal point position coincides with reference surface RS with respect to the surface W, as well as so that its rear focal point coincides with the front focal point position of relay lens 522. In addition, when the surface of surface W coincides with the reference surface, fourth relay lens 522 is set up so that the rear focal point position of relay lens 519 coincides with the front focal point position of fourth relay lens 522, and so that the rear focal point position of fourth relay lens 522 coincides with reference surface RS with respect to the surface W. Accordingly, second relay optical system RS2 is doubly telecentric.

Next, if third detection location 503 is illuminated by second relay optical system RS2, the light reflected from that detection location impinges on detection optical system DOS5 (FIG. 13) that concentrates the light reflected from detection location 503 onto receiving aperture plate 526 (FIG. 12). If surface W coincides with reference surface RS, detection optical system DOS5 maintains detection location 503 and receiving aperture plate 526, optically conjugate.

Detection optical system DOS5 is arranged so that reference surface RS with respect to surface W is positioned at its front focal point, and includes objective lens 523 that concentrates the light reflected from detection location 503 onto light receiving aperture plate 526, oscillating mirror 524 that reflects the light from objective lens 523 (reflects the optical axis of light receiving objective lens system 523 in a direction parallel to the Z-axis), and an aperture stop 525 that limits the light passing through objective lens system 523 and oscillating mirror 524.

Furthermore, detection optical system DOS5 objective lens 523 is telecentric with respect to the detection location 503 side. Photoelectric detection unit PDU5 (see FIG. 12) photoelectrically detects the displacement of the image of slit 512A at receiving aperture plate 526, and is arranged on the image-side of detection optical system DOS5. Photoelectric detection unit PDU5 includes receiving aperture plate 526 that has a slit-shaped aperture ("Slit") 526A, condensing lens 527 that concentrates light passing through slit 526A, and a detection 528, such as a photoelectric conversion element (photoelectric detector), that photoelectrically converts the light converged thereon by condensing lens 527.

Receiving aperture plate 526 is set up so that the long axis of slit 526A coincides with the long axis of the slit image formed on receiving aperture plate 526 by detection optical system DOS5. The detection operation involving oscillating mirror 24 is as explained previously in connection with previous embodiments, described above.

Next, the operation of this mode for carrying out the present invention will be explained referencing FIG. 12. Reticle R is illuminated through illumination system 9 by the light from a light source, which is not illustrated. The pattern within field F on illuminated reticle R is projected and exposed surface W of substrate S mounted at a position optically conjugate to reticle R. At this time, by measuring the displacement of surface W, the latter is moved in the Z-axis direction while maintaining parallelism, and is made to coincide with a predetermined position, such as reference surface RS (see FIG. 16).

In addition, controller 551, which drives stage drive apparatus STD in accordance with the detected surface displacement and adjusts the height of surface W in the Z-direction, is provided, receives signals from detector 528, and sends control signals to stage drive apparatus STD. Controller 551 includes and comprises a computing apparatus (not shown) that computes the average displacement of detection locations 501–503 (or N points) based on the output from detector 28.

When relay lenses 515 and 518 and relay lenses 519 and 522 are nearly of unity magnification, the sum of the displacements in the Z-axis direction of detection locations 501, 502, 503 results. The use of oscillating mirror 24 at this point is in order to perform the phase detection method based on the principle of the so-called photoelectric microscope, as mentioned previously. Controller 551 also detects the phase of the electric signal output from detector 528 by the frequency of the oscillation of mirror 524 due to mirror drive apparatus 529.

Figure 14:
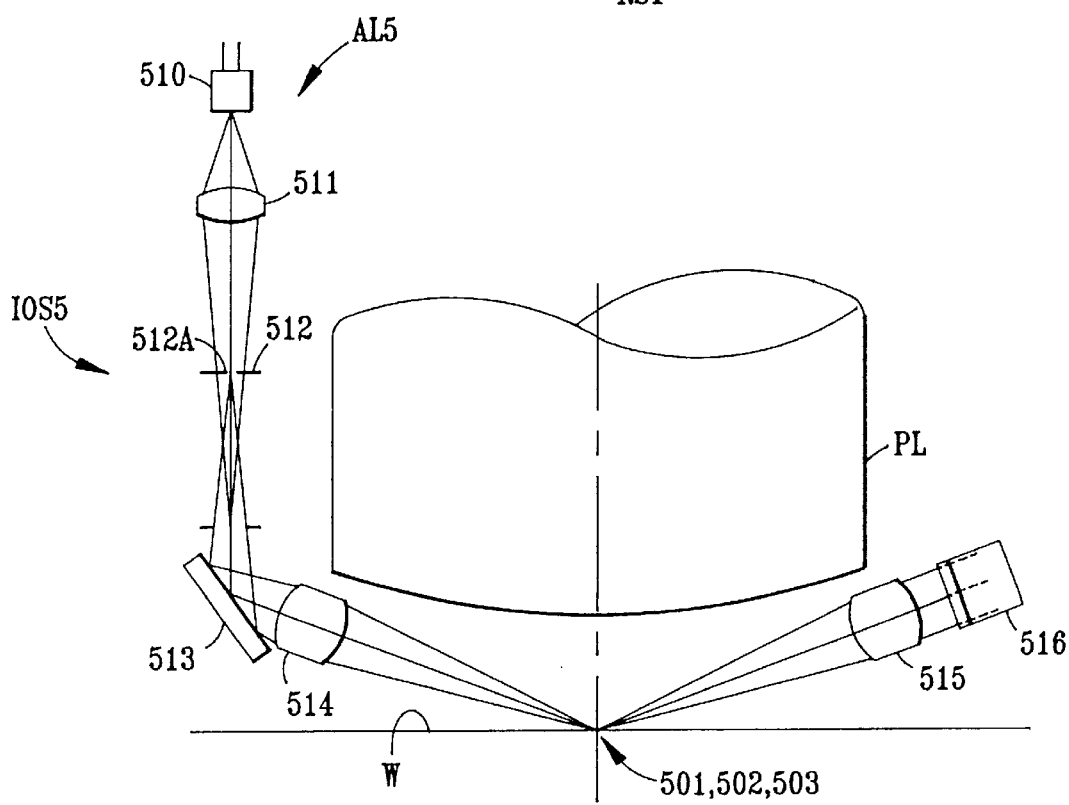
FIG. 14 is a side view of the position detection apparatus of the present invention shown in FIG. 12, as viewed in the direction of arrow AA in FIG. 12.

FIG. 13 is a plan view of the apparatus shown in FIG. 12, and FIG. 14 is a side view of the apparatus shown in FIG.

12 from the direction AA. The exposure field EF of projection lens PL is shown by a dashed line. With typical liquid crystal panels, numerous longitudinal and latitudinal rectilinear patterns are formed, and those rectilinear patterns are parallel to each side of the square of exposure field EF. FIG. 13 depicts each image at detection locations 501–503 being oriented in a direction 45° with respect to exposure field EF. In FIG. 14, the upper half of projection lens PL is omitted and not illustrated. This point applies to FIG. 16 as well.

Figure 15:
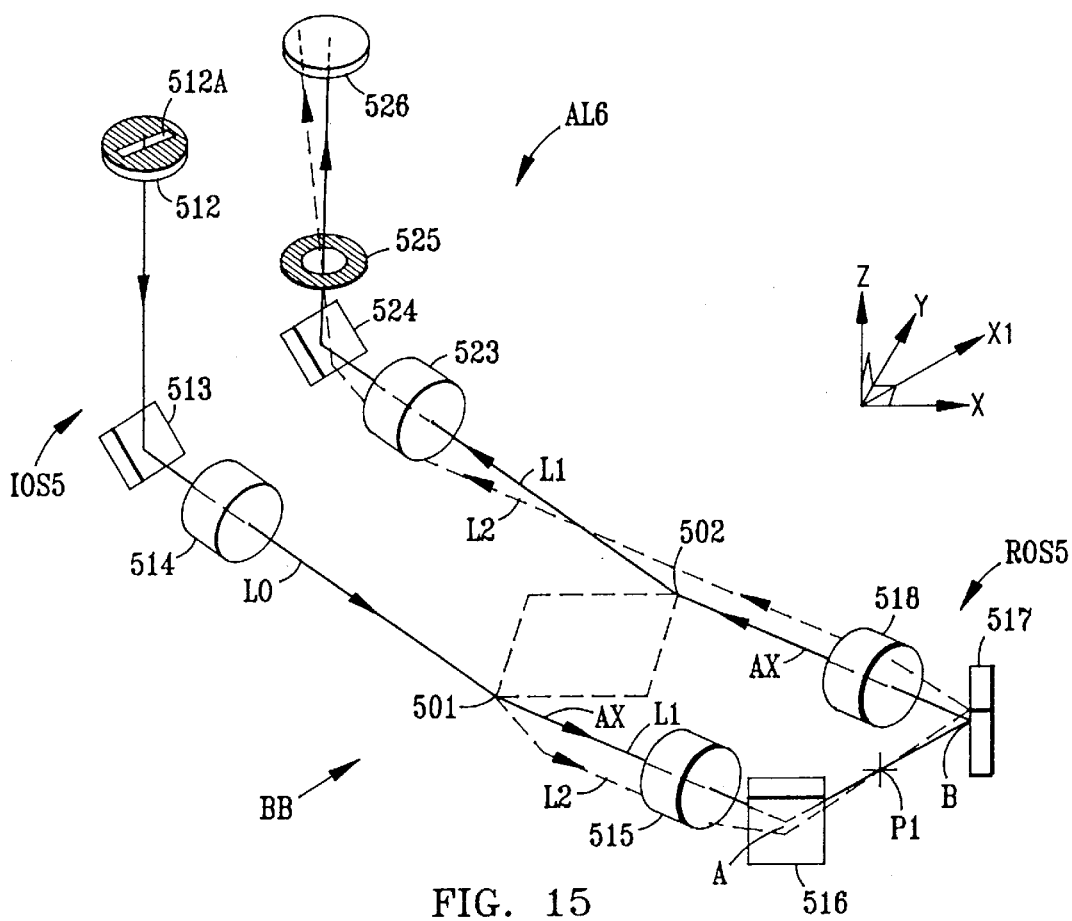
FIG. 15 is a perspective view of an inclination detection apparatus (i.e., auto-leveling system) of the present invention.

Next, the principle of how the displacements of the detection locations are optically summed will be explained, with reference to auto-leveling system AL6, in FIGS. 15 and 16, which is a "N=2" version of the "N=3" auto-leveling system ALS, discussed above. FIG. 15 is an oblique view with detection locations 501 and 502 as the two detection locations (N=2). FIG. 15 shows auto-leveling system AL6 from transmitting aperture plate 512 to receiving aperture plate 526. In addition, the arrows along the rays L0–L2 that indicate the direction proceeding from transmitting aperture plate 512 through receiving aperture plate 526 are designated the principle ray. The solid line indicates the principle ray L1 (hereinafter "reference ray") that proceeds along optical axis Ax of relay optical system ROS5 comprising components 515–518. The dashed line shows principal ray L2 deviated from reference ray L1.

Figure 16:
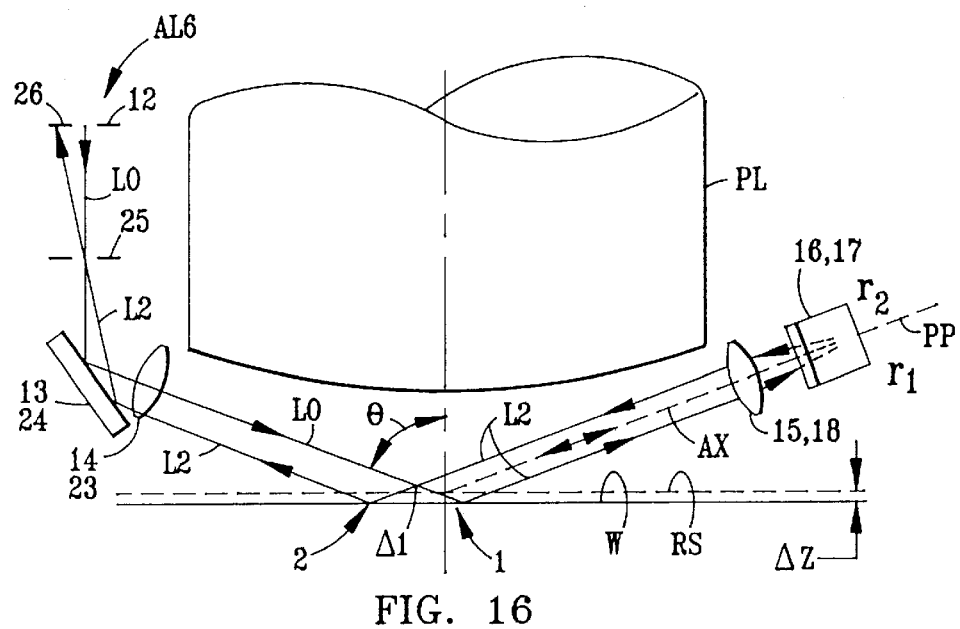
FIG. 16 is a side view of the inclination detection apparatus (i.e., auto-leveling system) of the present invention, as viewed in the direction of arrow BB in FIG. 15.

In addition, FIG. 15 and FIG. 16 show the transmitted light (illumination light) from the illumination optical system IOS5 as principal ray L0. Furthermore, the constituent elements of auto-leveling system A16 of FIG. 15 and FIG. 16, where appropriate, are assigned the same symbols as the constituent elements that have the same function in auto-leveling system ALS of FIGS. 12–14.

FIG. 16 is a side view along arrow BB of FIG. 15, and arrows along the rays point in the direction in which the rays proceed corresponding to FIG. 15. The light from transmitting aperture plate 512 (principal ray L0) is formed as an image at detection location 501 on surface W by objective lens 514.

The case wherein surface W in FIG. 16 is moved in the negative Z-direction (direction away from projection lens PL) by an amount $\Delta Z$ with respect to reference surface RS is now discussed. When surface W is the reference position (i.e., $\Delta Z$=0) the position of the image of slit 512A formed on receiving aperture plate 526 does not change. If surface W is displaced in the downward direction by $\Delta Z$, light L0 that strikes detection location 501 and becomes the reflected ray L2. The angle at which incident ray L0 impinges obliquely and angle θ formed between incident ray L0 and the optical axis of projection lens PL are typically between 70° to 80°.

Principal ray L2 impinges lower than reference ray L1 at relay lens 515, namely in region $r_1$ of re-illumination optical system ROS5 which is divided in two regions $r_1$ and $r_2$ by a prescribed plane PP, as discussed above in connection with FIG. 9. Accordingly, the predetermined plane PP shown in FIG. 16 includes optical axis Ax of relay optical system ROS5, and is orthogonal to the paper surface of FIG. 16.

In this manner, the re-illumination optical system ROS5 shown in FIG. 15 and FIG. 16 is configured so that, when surface W is displaced by $\Delta Z$, principal ray L2 from first detection location 501 entering re-illumination optical system ROS in the region $r_1$ is emitted from region $r_2$, and is directed to detection location 502. By configuring re-illumination optical system ROS5 in this manner, the image of slit 512A is displaced on receiving aperture plate 526 in an amount corresponding to the sum of the displacements of surface W plane at all detection locations.

In FIG. 16, effective displacement $\Delta 1$ in the Z-direction at a detection location 502 varies with magnification of the relay optical system ROS5, but is equivalent to $\Delta Z$ if the magnification is unity. Even if detection location 502 is likewise deviated downwards by just $\Delta Z$, ray L2 has this deviation amount added to it, and impinges upon objective lens 523.

If the magnification of relay optical system ROS5 is not unity, the deviation $\Delta Z$ of detection location 501 is magnified at detection location 502, resulting in a displacement $\Delta Z \times \beta$ and also results in the movement of the image of slit 512A on receiving aperture plate 526 by an amount wherein $\Delta Z$ of detection location 502 is added thereto, which is the equivalent of having weighted the value of detection location 501.

As shown in FIG. 12, if three points are detected on surface W, and if the magnification of relay lenses 515 and 518 is given as $\beta_1$, the magnification of relay lenses 519 and 522 as $\beta_2$, the displacement of detection location 501 as $\Delta Z1$, the displacement of detection location 503 as $\Delta Z3$, then the amount of movement $\Delta'$ of the ray reflected by detection location 503 is expressed by the following equation:

$$\Delta'=\{(\Delta Z1 \times \beta 1 + \Delta Z2) \times \beta 2\} + \Delta Z3$$

In addition, for example, if a weighting of 2× is given to just detection location 502, it is found that we can set $\beta 1=\frac{1}{2}$ and $\beta 2=2$.

Figure 17:
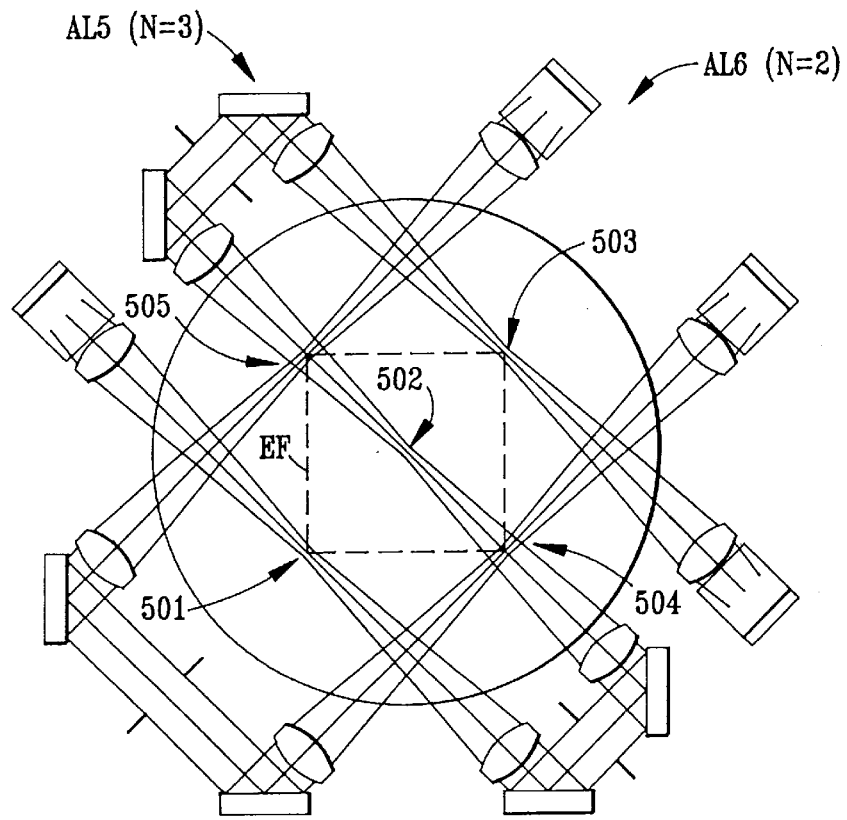
FIG. 17 is a plan view of the a preferred embodiment of the position detection apparatus of the present invention, which includes orthogonally oriented surface inclination detection apparatuses.

FIG. 17 is a preferred embodiment of the present invention, similar to that discussed in connection with FIG. 6 and FIG. 13, above wherein two auto-leveling systems of the present invention are disposed. In FIG. 17, auto-leveling system AL5 having three detection locations 501–503 (N=3) as shown in FIG. 12 and FIG. 13 is combined with an auto-leveling system AL6 having two detection locations 504 and 505 (N=2) as shown in FIG. 15. Auto-leveling systems AL5 and AL6 are configured so that the light beams of AL5 travel in directions that are substantially 90 degrees with respect to the direction of travel of the light beams of AL6. According to this embodiment of the present invention, if the magnification of the relay lenses is given as unity, the average value of a total of five points, the center of the exposure field EF of projection lens PL (detection location 502) and the four corners, is easily derived.

In the preferred embodiment of the present invention, in FIG. 15 for example, mirror 516 and 517 are provided between relay lenses 515 and 518. Nevertheless, the essential point is that the light beam may be deflected from detection location 501 to detection location 502 while passing through relay lenses 515 and 518. Note that the mirrors may be 1 or 3 or more elements. For example, in FIG. 12, if mirror 517 is omitted and just mirror 516 is used, the direction of the light beam after deflection is not in a direction parallel to the X1 axis, and the inclination of mirror 516 should be adjusted so that it directly faces detection location 502. This is the same even in FIG. 12. Again the relationship between relay lenses 519, 522 and mirrors 520 and 521 are also the same. Mirror 520 may be omitted and, in that case, the inclination of mirror 521 should be adjusted.

Figure 18:
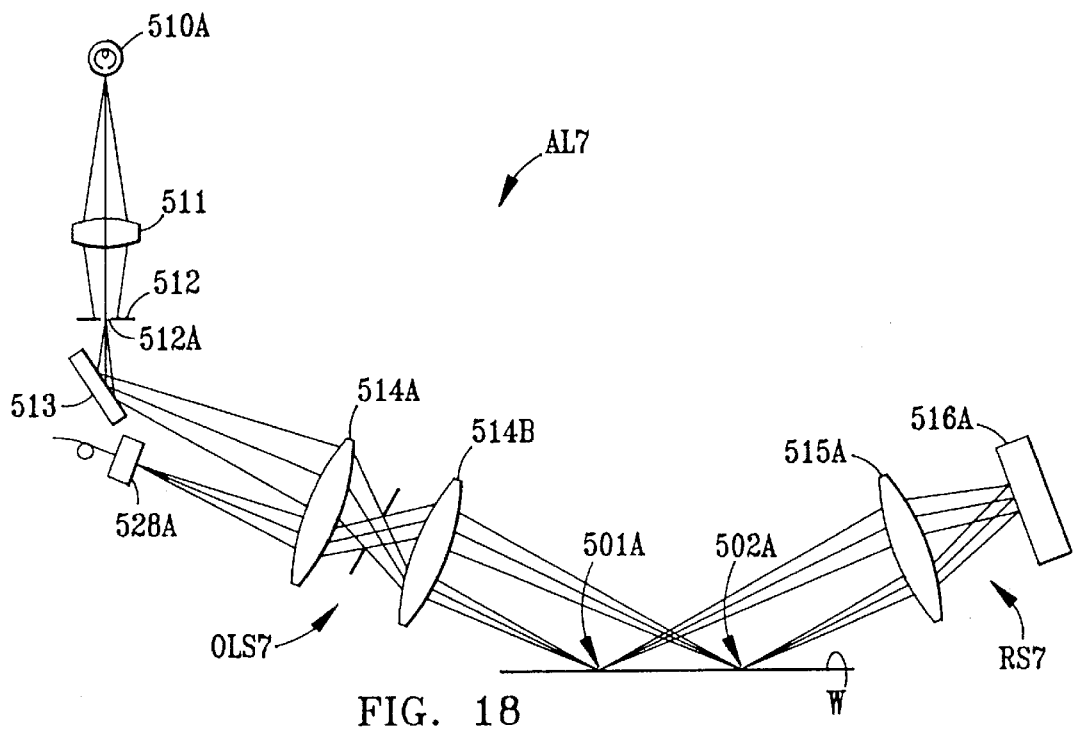
FIG. 18 is a side view of a preferred embodiment of a surface inclination detection apparatus of the present invention.

FIG. 18 is another preferred embodiment of the present invention used if the surface W is comparatively small. This example applies the focal point position detection recited in Japanese Patent Application Kokai No. Hei 5-129182.

In FIG. 18, the auto-leveling system AL7 includes a re-illumination optical system comprising one relay optical system RS7 and an objective lens system OLS7 (514A and 514B). OLS7 is configured so that it serves the dual purpose of the light transmitting objective lens in the illumination optical system and the light receiving objective lens system in the detection optical system.

The image of slit 512A illuminated through condenser lens 511 by the light of light source 510A is deflected so that it is obliquely incident upon surface W by mirror 513. Objective lens system OLS7 is arranged so that it is doubly telecentric. Light passes through objective lens 514A and objective lens 514B, and forms an image at detection location 501A. The light beam reflected at detection location 501A passes through relay lens 515A, is reflected by pupil mirror 516A, passes again through relay lens 515A and is re-imaged at detection location 502A. At this point, mirror 516A is arranged so that the reflection point comes to the rear focal plane of relay lens 515A. Slit plate 512 is arranged so that the long axis of the image of slit 512A at detection location 501A is orthogonal to the optical axis. Each element of the above optical system is arranged so that the long axis of the image of slit 512A at detection location 502A is parallel to the image at detection location 501A and has a spacing in a direction orthogonal to the long axis.

The light beam reflected at detection location 502A passes again through objective lens 514B and objective lens 514A, and forms an image on detector 528A. CCDs, line sensors, TDIs and the like may be used for detector 528A. Furthermore, in this system, slit 512A and light detector 528A are arranged so that detection location 501A and detection location 502A are optically conjugate and satisfy the Scheimpflug condition.

In this preferred embodiment the present invention, two detection locations, 501A and 502A (N=2) are used, but naturally more may be used. Also in the present invention detector 528A is used as the light receiving element, but as in the previous preferred embodiments, discussed above, a photoelectric microscope system based on an oscillating mirror may be used.

Figure 19:
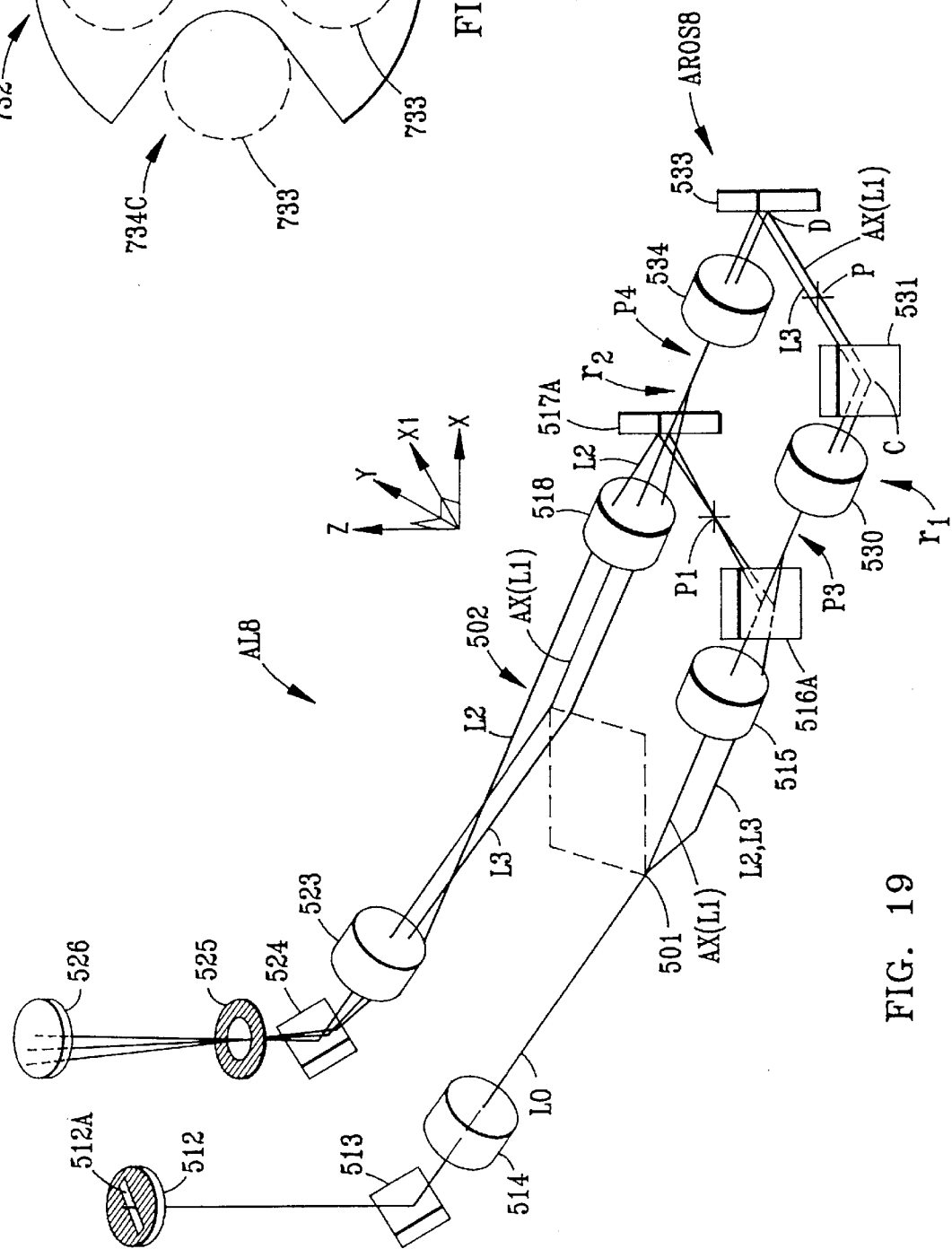
FIG. 19 is a perspective view of a preferred embodiment of the surface inclination detection apparatus which utilizes half-mirrors (beamsplitters) to form an auxiliary re-illumination optical system.

FIG. 19 is another preferred embodiment of the present invention wherein an auxiliary relay optical system AROS8, comprising components 530–534, is added to auto-leveling system AL6, shown in FIG. 4 and explained above, to form an auto-leveling system AL8. In this preferred embodiment, it is possible to also derive the difference between the deflection of detection location 501 and the deflection of detection location 502 on surface W.

In FIG. 19, the optical system from light transmitting slit 512A through light receiving slit 526 via half mirror 516A and half mirror 517A is configured the same as in FIG. 15. However, mirror 516 and mirror 517 are respectively replaced by half mirror 516A and half mirror 517A. Further included are relay lens 530, which concentrates the light beam that has been transmitted through mirror 516A, mirror 531 that reflects in the $X_1$ direction, mirror 533 that further reflects in the direction of half mirror 517A the deflected light beam, and relay lens 534 lying midway between mirror 533 and half mirror 517A. There is also an intermediate image formation position P in between mirror 531 and mirror 533.

In addition, a shutter (not shown) may be provided at pupil P3 in between half mirror 316A and relay lens 330 or at pupil P1 in between half mirror 516A and half mirror 517A.

The operation of auto-leveling system AL8 of the present invention is now explained referencing FIG. 19. First, transmitting aperture plate 512 is illuminated by the illumination light from a light source (not shown), and the light passing through slit 512A (principal ray L0) passes through mirror 513 and objective lens 514, forming image at detection location 501. The light reflected by detection location 501 (principal ray L2) passes through relay lens 515, and is reflected by half mirror 516A as a first beam splitter member.

This light (principal ray L2) is reflected by half mirror 517A as a second beam splitter member, passes through relay lens 518 and is re-imaged at detection location 502. This light (principal ray L2) reflected by detection location 502 re-images the image of slit 512A on receiving aperture plate 526 by means of objective lens 523, via mirror 524 and aperture stop 525. This optical path is shown by the dashed line in FIG. 19. This explanation is nearly the same as that for auto-leveling system AL6 in FIG. 15 up to this point.

Next, the light (principal ray L3) transmitted through half mirror 516A will be considered. The light (principal ray L3) that has transmitted through half mirror 516A is again deflected by mirror 531 as the first auxiliary deflection member, and then forms an intermediate image at point P conjugate with detection location 501 by means of relay lens 530 as the first auxiliary relay lens group. Furthermore, it is deflected by mirror 533 as the second auxiliary deflection member, passes through relay lens 534 as the second auxiliary relay lens group, is transmitted through half mirror 517A, is combined with the light that came via pupil P1, and re-images the image of a slit 512A at point 502 by means of relay lens 518.

Furthermore, the slit image at detection location 502 (slit image associated with principal ray L3) passes through objective lens 523 and forms an image on receiving aperture plate 526. The optical path at this time is shown by the dotted line in FIG. 19. At this point, for example, if the magnification between detection location 501 and detection location 502, determined by relay lenses 515 and 530, and relay lenses 518 and 534 is unity, the displacement of detection location 502 with respect to detection location 501 can be detected.

In the above manner, by passing the light through detection optical system (523 to 525) the difference between detection location 501 and detection location 502, namely, the inclination of surface W and the like, can be detected using the computing apparatus (not shown) of controller 51.

At this point, the optical operation of auxiliary relay optical system AROS8 will be explained referencing FIG. 19. Furthermore, when explaining the operation of auxiliary relay optical system AROS8, first relay lens 515 as the first relay lens group, auxiliary relay optical system AROS8, and second relay lens 518 as the second relay lens group will be regarded as one composite optical system.

Now, if surface W is displaced with respect to the reference surface RS (see, e.g., FIG. 16), the light (principle ray) L0 incident on first detection location 501 by illumination optical system 512–514 is reflected at first detection location 501 of the surface W, and impinges upon first relay lens 515 as reflected light (principle ray) L3. In other words, reflected light (principle ray) L3 impinges upon lower region $r_1$ (on the side lower than optical axis Ax) of the composite optical system which is divided into two regions $r_1$ and $r_2$ by a prescribed plane PP (not shown), as discussed in connection with prior preferred embodiments.

Incident light ray (principal ray) L3 intersects prescribed plane PP at pupil P3 of first relay lens 515, and proceeds above optical axis Ax (or reference ray L1). Subsequently, ray (principal ray) L3 is converted to a ray nearly parallel to optical axis Ax (or reference ray L1) by passing through the upper part of first auxiliary relay lens 530, passes through two mirrors 531 and 533 and impinges on the upper part of second auxiliary relay lens 534 in region $r_2$.

Subsequently, principal ray L3 that passed through second auxiliary relay lens 534 intersects prescribed plane PP at pupil position P4 formed by second auxiliary relay lens 534, and proceeds below optical axis Ax in region $r_1$.

Subsequently, principal ray L3 is converted to a ray nearly parallel to optical axis Ax (or reference ray L1) by passing through the lower part of second relay lens 518 (region $r_1$) and is directed toward detection location 502.

Here, prescribed plane PP is a plane formed by detection location 501 when surface W coincides with the reference position, deflection point C on mirror 310 deflection point D on mirror 533, and detection location 502 when surface W coincides with reference position.

Accordingly, the composite optical system shown in FIG. 19 is configured so that, when surface W is displaced by just ΔZ principal ray L3 from first detection location 501 that impinges upon the composite optical system in region $r_1$, is emitted region $r_2$ and is directed toward second detection location 502.

By constituting the composite optical system in this manner, a displacement in the image of slit 512A on receiving aperture plate 526 corresponds to the difference between the displacement of surface W at detection locations 501 and 502.

Figure 20:
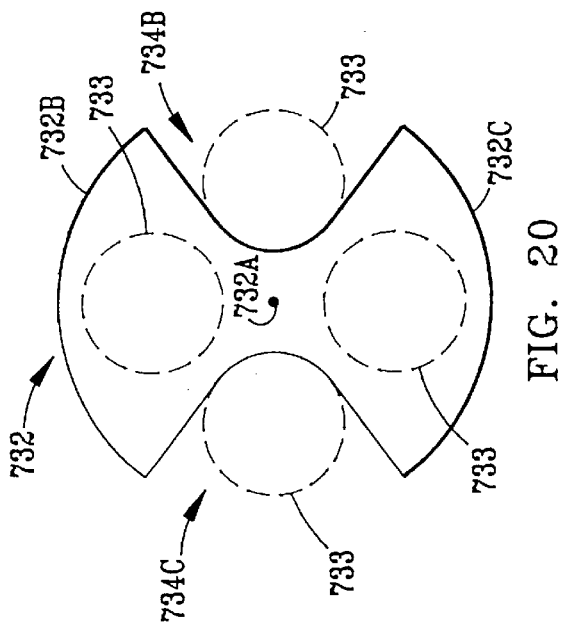
FIG. 20 is a front view of a preferred shutter used in a preferred embodiment of the present invention.

The detection of the sum or difference of the displacements of detection locations 501 and 502 may be switched by providing shutters in the optical path between half mirrors 516A and 517A, such as shutter 732 having two segments 732B and 732C as shown in FIG. 20. Such a shutter 732, for example, may be provided at pupil position P1 midway between half mirror 516A and half mirror 517A and also at pupil position P3 between half mirror 516A and relay lens 530. If shutters 732 are synchronized so that one side is closed when the other side is opened, the sum of and the difference between the displacements of detection location 501 and detection location 502 can be derived alternately. The positions of the shutters are not limited to the position of the pupils, and may be anywhere if the position intercepts the route of the light in the collective optical system. For example, it may be at position P of the intermediate image midway between mirror 531 and mirror 533.

Shutter 732 in FIG. 20 is configured so that, in the case of two segments, it can rotate about the center 732A thereof as the axis. Segments 732B and 732C are symmetric and fan-shaped and coupled at center 732A. Each segment is disposed such that a cross-section of light beam 733 comes to the center of each segment or cut-out 734B or 734C. If segments 732B or 732C coincides with the optical path of light beam 733, it is blocked. Conversely if the optical path of light beam 733 is between segments 732B and 732C, i.e., coincides with cut-outs 734B or 734C, light beam 733 passes.

In this preferred embodiment of the present invention, to prevent alteration of light due to half mirrors 516A and 517A, a dichroic mirror can be used in place thereof, and the detection of the sum and the detection of the difference can be separated by wavelength. In addition, a polarizing beam splitter may be used, and the detection of the sum and the detection of the difference may be separated by the P polarization and S polarization.

Furthermore, although not illustrated, the sum and difference can also be simultaneously detected by, for example, obliquely inserting a plane parallel plate and an optical member that shifts the optical axis between relay lens 530 and relay lens 534 wherein intermediate image plane P is interposed, providing an offset beforehand for the detection light of the difference, and further using a split sensor or an image pickup element like a CCD in lieu of receiving aperture plate 526 (see FIG. 19). For example, in the case of two detection locations, the displacement of each detection location can be derived by detecting the sum and the difference. In other words, not only can the average displacement of two points be derived, but the inclination between the two points can also be derived.

If the number of pupils in the optical system between the adjacent detection locations (say, detection location 501 and detection location 502) is an odd number as above, the sum of the displacements between the two points can be measured. If the number of pupils in the optical system between the adjacent detection locations is an even number, the difference of the displacements can generally be detected.

However, if an optical component such as a roof mirror that inverts the image is used, the displacements of the two points can be summed, as a special solution separate from the above-mentioned general solution, even if configured so that the optical system has an even number of pupils, in addition to having an optical component like a roof mirror.

Between all adjacent detection locations if the light from the first detection location passes above or below the optical axis of the optical relays system and if the light that was emitted from the optical relay system incident on the next detection location assumes a direction reversed from the previous optical relay system with respect to the optical axis of this optical system, the sum of the displacements can be measured.

Generally, if an optical component like a roof mirror is included, and if the total of the number of inversions due to the number of pupils (there is an inversion of light at a pupil) and roof mirrors and the like is odd, the sum can be detected. If the number of revisions are event, the difference can be detected. The inversion herein refers to the transition of the principal ray from one region of the space defined by prescribed plane PP (e.g., region $r_1$) to the opposite region (e.g., $r_2$). In other words, if the re-illumination optical system is configured so that, when surface W is displaced in the Z-direction relative to the reference surface, the principal ray impinging upon on region (e.g., $r_2$) of the re-illumination optical system is emitted from the opposite region of the re-illumination optical system (e.g., $r_2$) and is incident on the next detection location (for example, detection location 502). In this way, the principal ray will include the information of the total of the displacements of the detection locations from which it has been reflected.

By way of definition, a "roof mirror" is a mirror having a reflection surface arranged in a roof form which has a 90° angle; reflection at this surface causes the image to be simultaneously inverted and reversed, and the inverted image due to the lens can be changed to an erect image. A roof prism is one such type of roof mirror.

The utility of the above-described embodiments for use in manufacturing is apparent. For example, a photosensitive substrate for a semiconductor device is mounted on stage ST of the projection exposure apparatus provided with the above type of surface displacement detection apparatus (see FIG. 1 or FIG. 12) the average displacement of the surface of the substrate is detected by the surface displacement detection apparatus, and the substrate is moved and focused in the Z axis direction based on the detected average displacement. Consequently, a semiconductor device can be manufactured by exposing the surface of the photosensitive substrate. According to this method, since the average displacement or inclination of the photosensitive substrate can be detected and the exposure apparatus can be focused based thereon, even a large device like a liquid crystal display apparatus can be manufactured by a relatively compact apparatus.

According to the present invention as described above, if the displacement information of a plurality of detection positions is summed using a relay lens having unity magnification, the average value of all detection locations can be easily calculated by dividing the measurement value by the number of detection locations. In addition, a weight can be added to each detection location by changing the magnification of the relay optical system. Furthermore, even if there are many more detection locations than the first detection location and detection location on the substrate, a loss in throughput can be prevented, without using control by time division and the like, by receiving one beam of light that sums the displacement information of a plurality of detection positions. A significant cost reduction and a compact average displacement detection apparatus can be realized based on the fact that there are a plurality of detection locations even if one detector and one light source is used. In addition, by adding a fourth optical system, the difference between two points, namely the inclination, can also be derived.

As described above, use of an exposure process wherein inclination of a photosensitive surface W is detected through the use of a surface inclination detection apparatus employing one of the several embodiments of the present invention, the inclination of the photosensitive surface W is adjusted based on the detected inclination of photosensitive surface W. In this way, the pattern on reticle R is exposed, by way of a projection lens PL, onto a photosensitive surface in a manner that provides satisfactory manufacture of liquid crystal display devices, semiconductor integrated circuits or the like, at high throughput. Moreover, the present invention is not limited to employment of photolithographic operations for the manufacture of liquid crystal displays or semiconductor devices, but may also be applied to the manufacture of plasma display panels (PDP) and other such display devices, LSIs and other such semiconductor devices, thin-film magnetic heads, and CCDs and other types of detector elements. Also, during manufacture of semiconductor devices, liquid crystal display devices and the like, the exposure operation is not limited to being carried out following completion of the operation wherein the surface W position is detected by a surface inclination detection apparatus, but may also be carried out simultaneous therewith.

The above-described embodiments are meant to clarify the technical details of the present invention. For instance, the optical components are described and shown in the figures as single elements, whereas in practice one skilled in the art will know that such components may include multiple elements. Since certain changes may be made to the apparatuses and methods disclosed herein with respect to the to the aforementioned preferred embodiments without departing from the scope of the invention, it is intended that all matter contained in the above description and shown in the accompanying drawings be interpreted in an illustrative and not in a limiting sense.

What is claimed is:

1. A surface inclination detection apparatus for detecting the inclination of a surface W relative to a reference surface, the apparatus comprising:
    a) an illumination optical system that directs a first light beam toward a first detection location on the surface W;
    b) a re-illumination optical system that directs a second light beam comprising reflected light from said first detection location to a second detection location on the surface W removed from said first detection location;
    c) a detection optical system that converges light reflected from said second detection location onto a light-receiving surface; and
    d) a photoelectric detection unit that photoelectrically detects a displacement in the light received at said light-receiving surface.

2. A surface inclination detection apparatus according to claim 1, wherein said re-illumination optical system is designed to direct light reflected from said first detection location to said second detection location so that said light converged onto said light-receiving surface is displaced thereon by an amount corresponding to a difference between a displacement of said first detection surface in a direction normal to the reference surface and a displacement of said second detection location in a direction normal to the reference surface.

3. A surface inclination detection apparatus according to claim 2, wherein said re-illumination optical system includes optical axes defining a prescribed plane that divides said re-illumination system into first and second regions, further wherein said re-illumination optical system is designed so that when the surface W is displaced in a direction normal to the reference surface, a principal ray incident on said first detection location that enters said re-illumination system in one of said first and second regions is made to exit said re-illumination system in the other one of said first and second regions.

4. A surface inclination detection apparatus according to claim 1, wherein:
    a) said re-illumination optical system includes a deflecting member that deflects light reflected from the surface W at said first detection location; and
    b) a relay optical system for relaying light deflected by said deflecting member toward said second detection location such that said first and second detection locations are conjugate.

5. A surface inclination detection apparatus according to claim 1, wherein:
    a) said illumination optical system includes (i) a first aperture plate having a first aperture, and (ii) a lens that projects an image of said first aperture onto said first detection location; and
    b) said photoelectric detection unit includes (i) a second aperture plate having a second aperture, said second aperture plate disposed substantially optically conjugate to said first aperture plate, (ii) a detector disposed adjacent said second plate that detects light energy passing through said second aperture plate and provides an electrical signal that varies as a function of changes in said light energy, and (iii) a mirror adjacent said second aperture plate that oscillates so as to cause an image of said second aperture formed on said second aperture plate to traverse said second aperture.

6. A surface inclination detection apparatus according to claim 5, further including a computational apparatus connected to said photoelectric detection unit that computes the inclination of the surface W based on said electrical signal.

7. An apparatus according to claim 1, further including a processing system that derives the displacement of the surface W based on an output from said photoelectric detection unit, said output including displacement information at said first detection location and displacement information at said second detection location.

8. An apparatus according to claim 1, wherein said first beam and said second beam lie in first and second planes, respectively, that are substantially parallel and non-coplanar.

9. An apparatus according to claim 1, wherein said re-illumination optical system includes a relay optical unit and a mirror having a reflecting surface disposed at a rear focal plane of said relay optical unit.

10. A method of exposing a substrate having a photosensitive surface, comprising the steps of:
 a) providing a projection exposure apparatus comprising:
  i) an exposure illumination optical system for illuminating with exposure light a mask having a pattern;
  ii) a projection optical system for projecting an image of the mask onto the photosensitive surface;
  iii) a substrate stage for supporting the substrate;
  iv) a surface inclination detection apparatus comprising:
   (1) a detection illumination optical system for directing surface detection light to a first detection location on the photosensitive surface;
   (2) a re-illumination optical system that directs the surface detection light reflected from said first detection location to a second detection location on the photosensitive surface removed from said first detection location;
   (3) a detection optical system for detecting an inclination of the photosensitive surface relative to a reference surface when the substrate is placed on said substrate stage, said detection optical system separated from said illumination optical system so as to receive surface detection light reflected from said second detection location removed from said first detection location; and
   (4) a photoelectric detection unit that detects the displacement of the surface detection light;
 b) disposing the substrate on said substrate stage;
 c) detecting the inclination of said photosensitive surface of said substrate using said surface inclination detection apparatus;
 d) adjusting the inclination of said photosensitive surface based on an output from said photoelectric detection unit; and
 e) exposing said photosensitive surface with said exposure light using said exposure illumination optical system and said projection optical system.

11. A method of exposing a photosensitive surface according to claim 10, wherein said exposure light has an exposure light wavelength, said surface detection light has a surface detection light wavelength, and wherein said exposure light wavelength and said surface detection light wavelength are different.

12. A surface detection apparatus that detects the displacement of a surface W with respect to a reference surface, the apparatus comprising:
 a) an illumination optical system that directs light toward a first detection location of N different detection locations initially removed from each other on the surface W, wherein N≧2;
 b) a re-illumination optical system that directs said light, upon reflection by said first detection location, onto remaining N−1 different detection locations on the surface W so that said light from said illumination optical system impinges on each of said N different detection locations;
 c) a detection optical system that converges said light upon reflection from a last detection location on the surface W, onto a light receiving surface;
 d) a photoelectric detection unit that photoelectrically detects the displacement of said light received at said light receiving surface; and
 e) wherein said detection optical system is separated from said illumination optical system so as to receive light reflected from said second detection location removed from said first detection location.

13. A surface detection apparatus according to claim 12, wherein said re-illumination optical system is designed to direct said light reflected from said first detection location to said remaining N−1 different detection locations so that said light converged onto said light receiving surface is displaced by an amount corresponding to the sum of displacements of the surface W in a direction normal to the reference surface, at said N different detection locations.

14. A surface detection apparatus according to claim 12, wherein said re-illumination optical system includes a relay optical system that directs light reflected from the surface W at said first detection location to another one of said different detection locations on the surface W.

15. A surface detection apparatus according to claim 14, wherein said relay optical system has an optical magnification corresponding to a set of predetermined weights associated with the displacement of the surface W normal to the reference surface at said different detection locations.

16. A surface detection apparatus according to claim 14, wherein said relay optical system has:
 a) a deflection member that reflects light reflected from the surface W at said first detection location toward another one of said different detection locations; and
 b) two relay lens groups disposed such that said first detection location and said another one of said different detection locations are substantially conjugate.

17. A surface detection apparatus according to claim 14, wherein:
 a) said relay optical system has a first relay lens group that relays light reflected from said first detection location, a second relay lens group that relays light that passes through said first relay lens group, and first and second beam splitter members arranged between said first relay lens group and said second relay lens group; and
 b) an auxiliary relay optical system for directing light divided from said first beam splitter member to said second beam splitter member.

18. A surface detection apparatus according to claim 17, wherein said first relay lens group, said auxiliary relay optical system and said second relay lens group form a composite optical system, wherein said composite optical system is divided in two parts by a third prescribed plane including optical axes of said composite optical system, wherein said composite optical system is configured such that when the surface W is displaced normal to the reference surface, a principle ray which intercepts one part of said composite optical system is emitted from another part of said composite optical system.

19. A surface detection apparatus according to claim 12, further including a computing apparatus connected to said photoelectric detection that computes an average displacement of said surface W, based on said output received from said photoelectric detection unit.

20. A surface detection apparatus according to claim 12, wherein said re-illumination optical system includes a first relay optical system that directs light reflected from the surface W at said first detection location to a second detection location of N said different detection locations, and a second relay optical system that directs light reflected from the surface W at said second detection location to a third detection location of N said different detection locations.

21. A surface detection apparatus according to claim 20, further wherein:
 a) said first relay optical system includes first optical axes defining a first prescribed plane that divides said first optical system into first and second regions, further wherein said first relay optical system is designed so that when the surface W is displaced in a direction normal to the reference surface, a first principal ray incident on said first detection location that enters said first relay optical system in one of said first and second regions is made to exit said first relay optical system in the other one of said first and second regions; and b) wherein said second relay optical system includes second optical axes defining a second prescribed plane that divides second said relay optical system into third and fourth regions, further wherein said second relay optical system is designed so that when the surface W is displaced in a direction normal to the reference surface, a second principal ray incident on said second detection location that enters said second relay optical system in one of said third or fourth regions is made to exit said second relay region in the other of said third and fourth regions.

22. A surface detection apparatus according to claim 20, wherein said first and second relay optical systems have respective optical magnifications corresponding to a set of predetermined weights associated with the displacement of the surface W normal to the reference surface at said different detection locations.

23. A surface detection apparatus according to claim 12, wherein said re-illumination system includes optical axes defining a prescribed plane that divides said re-illumination system into first and second regions, further wherein said re-illumination optical system is designed so that when the surface W is displaced in a direction normal to the reference surface, a principal ray incident on said first detection location that enters said re-illumination system in one of said first and second regions is made to exit said re-illumination system in the other one of said first and second regions.

24. A surface detection apparatus according to claim 12, wherein:

a) said illumination optical system includes a first plate with a first aperture, and an objective lens that projects said aperture onto said first detection location;

b) said photoelectric detection unit includes a second plate with a second aperture, and a photoelectric detector that converts light passing through said second aperture and onto said detector into an electrical signal; and c) said detection optical system includes a mirror that oscillates such that an image of said second aperture traverses said second plate.

25. A method of exposing a substrate having a photosensitive surface, comprising the steps of:

a) providing a projection exposure apparatus comprising:
   i) an exposure illumination optical system for illuminating a mask having a pattern with exposure light;
   ii) a projection system for projecting an image of the mask onto the photosensitive surface;
   iii) a substrate stage for supporting the substrate;
   iv) a surface detection apparatus comprising:
   (1) a detection illumination optical system that directs surface detection light toward a first detection location of N different detection locations removed from each other on the photosensitive surface wherein N≧2;
   (2) a re-illumination optical system that directs said surface detection light, upon reflection by said first detection location, onto remaining N−1 different detection locations on the photosensitive surface so that said surface detection light from said detection illumination optical system impinges on each of said N different detection locations;
   (3) a detection optical system for detecting a displacement of the photosensitive surface relative to a reference surface when the substrate is placed on said substrate stage, said detection optical system separated from said illumination optical system so as to receive said surface detection light reflected from a last detection location on the photosensitive surface; and
   (4) a photoelectric detection unit that detects the displacement of the surface detection light;

b) disposing the substrate on said substrate stage;

c) detecting the displacement of the photosensitive surface of said substrate by using said surface detection apparatus;

d) adjusting the displacement of the photosensitive surface relative to the reference surface based upon an output from said photoelectric detection unit; and e) exposing the photosensitive surface with said exposure light by using said exposure illumination optical system and said projection system.

26. A surface inclination detection apparatus for detecting the inclination of a surface W relative to a reference surface, the apparatus comprising:

a) an illumination optical system that directs a first light beam lying in a first plane toward a first detection location on the surface W;

b) a re-illumination optical system that directs a second light beam comprising reflected light from said first detection location and lying in a second plane to a second detection location on the surface W initially removed from said first detection location, wherein said first and second planes are substantially parallel and non-coplanar;

c) a detection optical system that converges light reflected from said second detection location onto a light-receiving surface; and d) a photoelectric detection unit that photoelectrically detects a displacement in the light received at said light-receiving surface.

27. A surface inclination detection apparatus according to claim 26, wherein:

a) said illumination optical system includes (i) a first aperture plate having a first aperture, and (ii) a lens that projects an image of said first aperture onto said first detection location; and b) said photoelectric detection unit includes (i) a second aperture plate having a second aperture, said second aperture plate disposed substantially optically conjugate to said first aperture plate, (ii) a detector disposed adjacent said second plate that detects light energy passing through said second aperture plate and provides an electrical signal that varies as a function of changes in said light energy, and (iii) a mirror adjacent said second aperture plate that oscillates so as to cause an image of said second aperture formed on said second aperture plate to traverse said second aperture.

28. An apparatus according to claim 26, further including a processing system that derives the inclination of the surface W based on an output from said photoelectric detection unit, said output including the displacement information at said first detection location and the displacement information at said second detection location.

29. An apparatus according to claim 26, wherein said re-illumination optical system is designed to direct light reflected from said first detection location to said second detection location so that said light converged onto said light-receiving surface is displaced thereon by an amount corresponding to a difference between a displacement of said first detection surface in a direction normal to the reference surface and a displacement of said second detection location in a direction normal to the reference surface.

30. A surface inclination detection apparatus according to claim 26, wherein said re-illumination optical system includes optical axes defining a prescribed plane that divides said re-illumination system into first and second regions, further wherein said re-illumination optical system is designed such that when the surface W is displaced in a direction normal to the reference surface, a principal ray incident on said first detection location that enters said re-illumination system in one of said first and second regions is made to exit said re-illumination system in the other one of said first and second regions.

31. A method of exposing a photosensitive surface of a substrate, comprising the steps of:
 a) providing a projection exposure apparatus capable of emitting exposure light having a substrate stage arranged at or near an image plane and a surface inclination detection apparatus capable of emitting surface detection light and detecting an inclination of the photosensitive surface relative to a reference surface when the substrate is placed on said stage;
 b) disposing the substrate on said stage and directing said surface detection light in a first beam lying in a first plane towards a first detection location on the photosensitive surface and causing said surface detection light to be reflected therefrom;
 c) forming a second beam comprising said surface detection light reflected from said first detection location and lying in a second plane substantially parallel and non-coplanar with said first plane;
 d) directing said second beam to a second detection location on the photosensitive surface initially removed from said first detection location, and causing said surface detection light to be reflected therefrom toward a light-receiving surface;
 e) adjusting the inclination of the photosensitive surface relative to said reference surface based on information detected in said detecting step d); and
 f) exposing the photosensitive surface with said exposure light.

32. A method of exposing a photosensitive surface according to claim 31, wherein said exposure light has an exposure light wavelength, said surface detection light has a surface detection light wavelength, and wherein said exposure light wavelength and said surface detection light wavelength are different.

33. A method of exposing a substrate having a photosensitive surface, comprising the steps of:
 a) providing a projection exposure apparatus comprising:
  i) an exposure illumination optical system for illuminating a mask having a pattern with exposure light;
  ii) a projection system for projecting an image of the mask onto the photosensitive surface;
  iii) a substrate stage for supporting the substrate;
  iv) a surface detection apparatus comprising:
   1) a detection illumination optical system for directing surface detection light to a first detection location on the photosensitive surface;
   2) a re-illumination optical system that directs the surface detection light reflected from said first detection location to a second detection location on the photosensitive surface removed from said first detection location, said re-illumination optical system including a relay optical unit and a mirror having a reflective surface disposed at a focal plane of said relay optical unit;
   3) a detection optical system for detecting a displacement of a photosensitive surface with respect to a reference surface when the substrate is placed on said substrate stage, said detection optical system separated from said illumination optical system so as to receive the surface detection light reflected from said second detection location removed from said first detection location; and
   4) a photoelectric detection unit that detects the displacement of the surface detection light;
 b) disposing the substrate on said substrate stage;
 c) detecting the displacement of the photosensitive surface by using said surface detection apparatus;
 d) adjusting the displacement of the photosensitive surface with respect to the reference surface based upon an output from said photoelectric detection unit; and
 e) exposing the photosensitive surface with said exposure light by using said exposure illumination optical system and said projection system.

* * * * *